(12) United States Patent
Sugiyama

(10) Patent No.: US 11,526,071 B2
(45) Date of Patent: Dec. 13, 2022

(54) PROJECTOR

(71) Applicant: SEIKO EPSON CORPORATION, Tokyo (JP)

(72) Inventor: Nobuo Sugiyama, Azumino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 171 days.

(21) Appl. No.: 17/131,061

(22) Filed: Dec. 22, 2020

(65) Prior Publication Data

US 2021/0200072 A1    Jul. 1, 2021

(30) Foreign Application Priority Data

Dec. 25, 2019 (JP) .............................. JP2019-234456

(51) Int. Cl.
G03B 21/16 (2006.01)
H05K 7/20 (2006.01)

(52) U.S. Cl.
CPC ........... *G03B 21/16* (2013.01); *H05K 7/2039* (2013.01); *H05K 7/20136* (2013.01)

(58) Field of Classification Search
CPC .. G03B 21/16; H04N 9/3144; H05K 7/20145; H05K 7/20136; H05K 7/2039
See application file for complete search history.

(56) References Cited

U.S. PATENT DOCUMENTS

| | | | | |
|---|---|---|---|---|
| 6,713,973 | B2 * | 3/2004 | Erhardt | H05B 41/2928 315/291 |
| 7,438,420 | B2 * | 10/2008 | Harada | H04N 9/3155 315/117 |
| 7,448,759 | B2 * | 11/2008 | Fukano | H04N 5/74 353/85 |
| 7,891,819 | B2 * | 2/2011 | Osumi | G03B 21/16 353/54 |
| 8,251,513 | B2 * | 8/2012 | Itsuki | G03B 21/16 353/54 |
| 8,517,540 | B2 | 8/2013 | Terao | |

(Continued)

FOREIGN PATENT DOCUMENTS

| | | |
|---|---|---|
| CN | 102621787 A | 8/2012 |
| JP | H11-057383 A | 3/1999 |

(Continued)

*Primary Examiner* — Bao-Luan Q Le
(74) *Attorney, Agent, or Firm* — Dority & Manning, P.A.

(57) ABSTRACT

A projector includes a first cooling device configured to cool a first cooling target based on transformation of a refrigerant into gas, a second cooling device configured to cool a second cooling target, and a heat conduction member. A refrigerant generator of the first cooling device includes a moisture absorbing and desorbing member, a first blower, a heat exchanger, and a second blower configured to send the air to the heat exchanger. The second cooling device includes a third blower and a circulation path through which the air circulates between the third blower and the second cooling target. The heat conduction member includes a heat absorber configured to absorb heat radiated from the second cooling target and a heat dissipator disposed on the inside of the first cooling device. The heat radiated from the heat dissipator is transferred to the moisture absorbing and desorbing member.

14 Claims, 11 Drawing Sheets

(56) References Cited

U.S. PATENT DOCUMENTS

| | | | |
|---|---|---|---|
| 8,777,423 B2* | 7/2014 | Okada | G03B 21/2086 |
| | | | 353/85 |
| 10,514,594 B2* | 12/2019 | Okada | H04N 9/315 |
| 10,627,708 B2* | 4/2020 | Sugiyama | F25B 19/00 |
| 10,705,414 B2* | 7/2020 | Okada | F25B 19/00 |
| 10,712,643 B2* | 7/2020 | Sugiyama | F28D 15/0283 |
| 10,890,836 B1* | 1/2021 | Okada | H04N 9/3144 |
| 10,983,425 B2* | 4/2021 | Sugiyama | G03B 21/16 |
| 10,989,994 B2* | 4/2021 | Okada | G03B 21/16 |
| 11,009,784 B2* | 5/2021 | Sugiyama | G03B 21/16 |
| | | | 353/54 |
| 11,029,587 B2* | 6/2021 | Sugiyama | G03B 21/16 |
| | | | 348/744 |
| 11,029,588 B2* | 6/2021 | Sugiyama | G03B 21/16 |
| | | | 353/57 |
| 11,163,223 B2* | 11/2021 | Sugiyama | G03B 21/16 |
| | | | 62/513 |
| 11,163,224 B2* | 11/2021 | Sugiyama | F24F 3/1423 |
| | | | 62/271 |
| 2002/0191159 A1 | 12/2002 | Nagao et al. | |
| 2003/0218602 A1* | 11/2003 | Naito | H04N 5/74 |
| | | | 345/204 |
| 2004/0212787 A1* | 10/2004 | Kida | G03B 21/18 |
| | | | 353/94 |
| 2004/0239887 A1* | 12/2004 | Yasuda | H04N 5/74 |
| | | | 353/57 |
| 2005/0219430 A1* | 10/2005 | Nagano | H04N 5/165 |
| | | | 349/9 |
| 2005/0242741 A1* | 11/2005 | Shiota | H04N 9/31 |
| | | | 315/112 |
| 2006/0082964 A1* | 4/2006 | Taniguchi | G03B 21/16 |
| | | | 361/679.21 |
| 2006/0120084 A1* | 6/2006 | Sueoka | G03B 21/16 |
| | | | 362/294 |
| 2008/0030689 A1* | 2/2008 | Hsu | G03B 21/16 |
| | | | 353/57 |
| 2008/0236191 A1* | 10/2008 | Tsuchiya | G03B 21/16 |
| | | | 62/513 |
| 2008/0297053 A1* | 12/2008 | Yun | G03B 21/2013 |
| | | | 315/88 |
| 2009/0086169 A1 | 4/2009 | Nakamura | |
| 2010/0132379 A1* | 6/2010 | Wu | F24F 3/1423 |
| | | | 62/271 |
| 2010/0302463 A1* | 12/2010 | Matsumoto | G03B 21/16 |
| | | | 348/744 |
| 2011/0025987 A1* | 2/2011 | Furumi | G03B 21/16 |
| | | | 353/57 |
| 2011/0032489 A1* | 2/2011 | Kimoto | H04N 9/3144 |
| | | | 353/56 |
| 2011/0037954 A1* | 2/2011 | Tsuchiya | G03B 21/16 |
| | | | 353/54 |
| 2011/0242499 A1* | 10/2011 | Terao | G03B 21/16 |
| | | | 353/57 |
| 2012/0229710 A1* | 9/2012 | Okazawa | H04N 9/3155 |
| | | | 348/748 |
| 2013/0107223 A1* | 5/2013 | Toyooka | G03B 21/2033 |
| | | | 353/31 |
| 2013/0128457 A1* | 5/2013 | Shioya | G02F 1/133385 |
| | | | 361/695 |
| 2013/0128458 A1* | 5/2013 | Shioya | G02F 1/133385 |
| | | | 361/695 |
| 2013/0148085 A1* | 6/2013 | Sakamoto | G03B 21/16 |
| | | | 353/52 |
| 2013/0271736 A1* | 10/2013 | Terashima | G03B 21/2053 |
| | | | 353/57 |
| 2014/0218693 A1* | 8/2014 | Kubo | H04N 9/3188 |
| | | | 353/57 |
| 2015/0009218 A1* | 1/2015 | Fukutomi | H04N 9/3188 |
| | | | 345/428 |
| 2015/0029469 A1* | 1/2015 | Kubo | G03B 21/16 |
| | | | 353/57 |
| 2016/0105652 A1* | 4/2016 | Yamashita | H04N 9/3144 |
| | | | 348/333.1 |
| 2018/0239227 A1* | 8/2018 | Suzuki | G03B 21/2026 |
| 2019/0005893 A1* | 1/2019 | Naitou | G03B 21/2053 |
| 2019/0196311 A1 | 6/2019 | Sugiyama et al. | |

FOREIGN PATENT DOCUMENTS

| | | |
|---|---|---|
| JP | H11-169644 A | 6/1999 |
| JP | H11-223464 A | 8/1999 |
| JP | 2002-326012 A | 11/2002 |
| JP | 2002-372748 A | 12/2002 |
| JP | 2009-086271 A | 4/2009 |
| JP | 2010-107751 A | 5/2010 |
| JP | 2010-223443 A | 10/2010 |
| JP | 2011-036768 A | 2/2011 |
| JP | 2011-215457 A | 10/2011 |
| JP | 2014-087797 A | 5/2014 |
| JP | 2017-020715 A | 1/2017 |
| JP | 2019-117332 A | 7/2019 |

* cited by examiner

FIG. 9

PROJECTOR

The present application is based on, and claims priority from JP Application Serial Number 2019-234456, filed Dec. 25, 2019, the disclosure of which is hereby incorporated by reference herein in its entirety.

BACKGROUND

1. Technical Field

The present disclosure relates to a projector.

2. Related Art

JP-A-2019-117332 (Patent Literature 1) describes a projector including a refrigerant generator that generates a refrigerant. In the projector described in Patent Literature 1, the refrigerant generated in the refrigerant generator changes to gas to cool a cooling target in the projector.

In the projector, there has been a demand for further improvement of refrigerant generation efficiency in the refrigerant generator.

SUMMARY

A projector according to an aspect of the present disclosure includes a first cooling target and a second cooling target different from the first cooling target. The projector includes: a light source configured to emit light; a light modulator configured to modulate the light emitted from the light source; a first cooling device configured to cool the first cooling target based on transformation of a refrigerant into gas; a second cooling device configured to cool the second cooling target; and a heat conduction member coupled to the first cooling device and the second cooling device. The first cooling device includes: a refrigerant generator configured to generate the refrigerant; and a refrigerant sender configured to transfer the generated refrigerant to the first cooling target. The refrigerant generator includes: a moisture absorbing and desorbing member configured to rotate; a first blower configured to send air to a first portion of the moisture absorbing and desorbing member located in a first region; a heat exchanger coupled to the refrigerant sender; and a second blower configured to send, to the heat exchanger, the air around a second portion of the moisture absorbing and desorbing member located in a second region different from the first region. The second cooling device includes: a third blower configured to send the air to the second cooling target; and a circulation path on which the second cooling target is disposed and through which the air circulates between the third blower and the second cooling target. The heat conduction member includes: a heat absorber disposed on the circulation path and configured to absorb heat radiated from the second cooling target; and a heat dissipator disposed on the inside of the first cooling device and configured to radiate the heat absorbed by the heat absorber. The heat radiated from the heat dissipator is transferred to the second portion of the moisture absorbing and desorbing member.

BRIEF DESCRIPTION OF THE DRAWINGS

FIG. 9 is a diagram showing a refrigerant holding section in the first embodiment.

DESCRIPTION OF EXEMPLARY EMBODIMENTS

Figure 1:
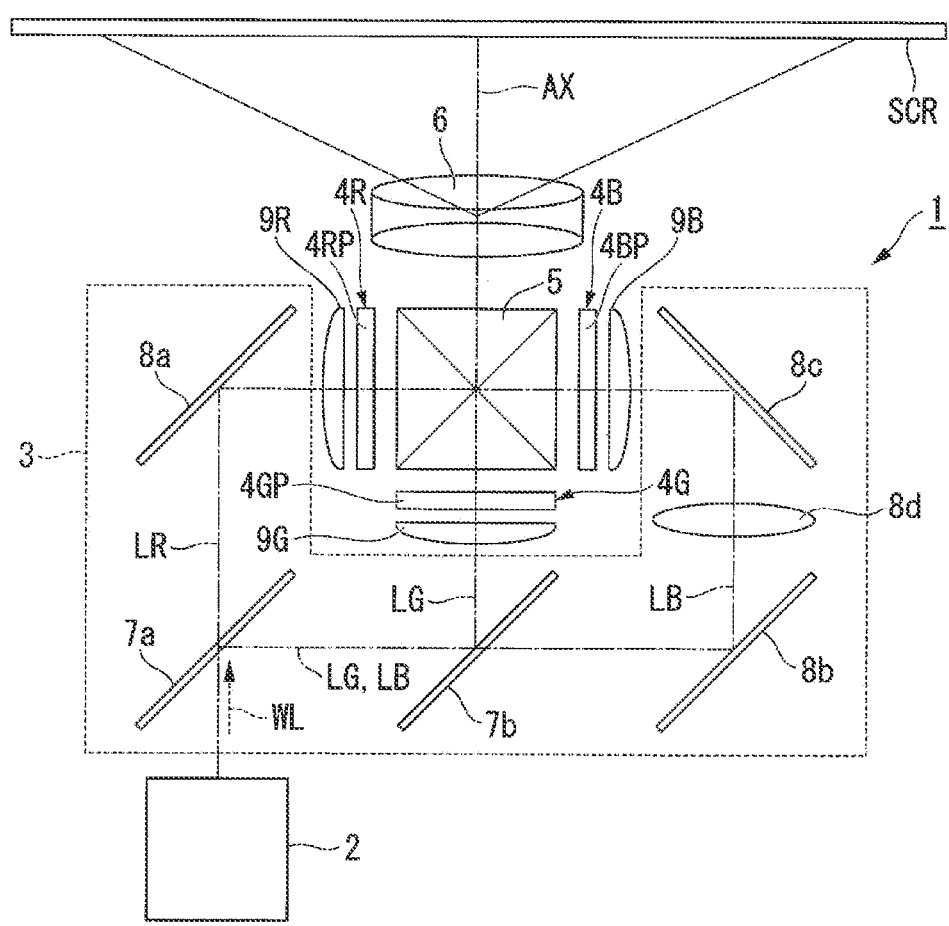
FIG. 1 is a schematic configuration diagram showing a projector in a first embodiment.

Projectors according to embodiments of the present disclosure are explained below with reference to the drawings. The scope of the present disclosure is not limited to the embodiments explained below and can be optionally changed within the scope of the technical idea of the present disclosure. In the drawings referred to below, scales, numbers, and the like in structures are sometimes differentiated from scales, numbers, and the like in actual structures in order to clearly show components.

First Embodiment

Figure 2:
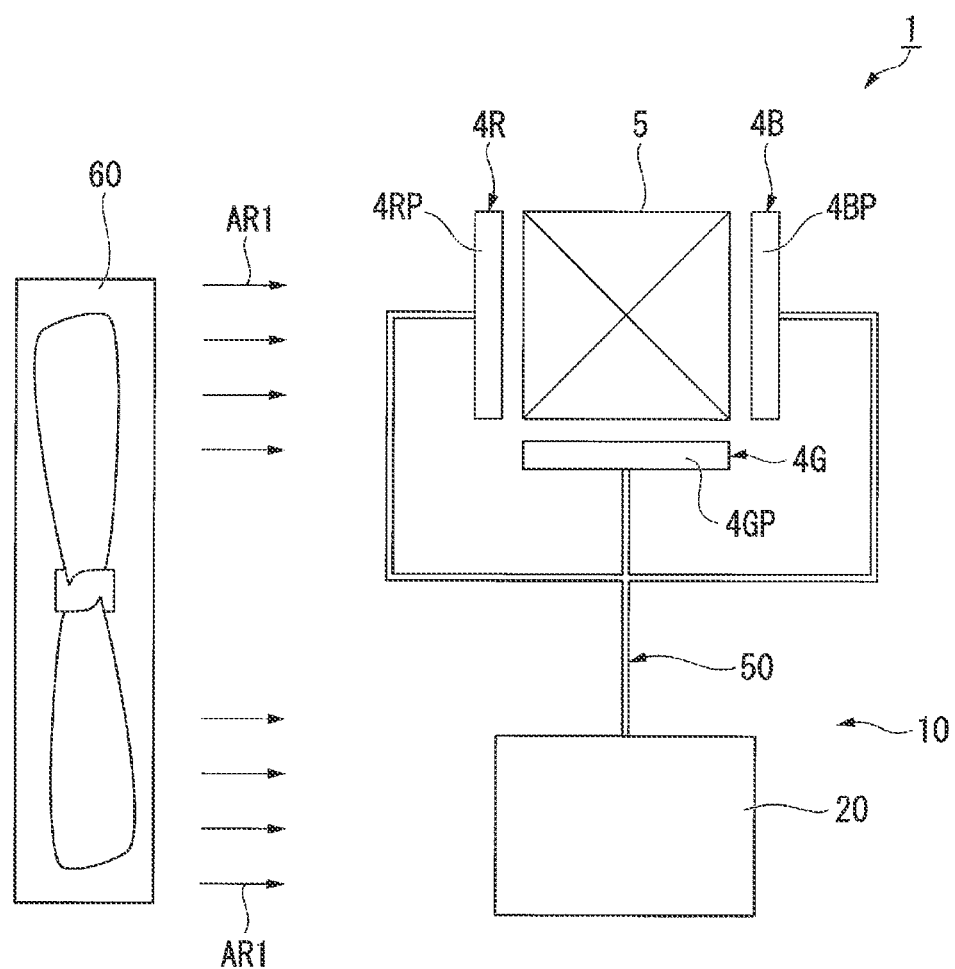
FIG. 2 is a schematic diagram showing a part of the projector in the first embodiment.

FIG. 1 is a schematic configuration diagram showing a projector 1 in a first embodiment. FIG. 2 is a schematic diagram showing a part of the projector 1 in this embodiment. As shown in FIG. 1, the projector 1 includes a light source 2, a color separation optical system 3, a light modulation unit 4R, a light modulation unit 4G, a light modulation unit 4B, a light combination optical system 5, and a projection optical device 6. The light modulation unit 4R includes a light modulator 4RP. The light modulation unit 4G includes a light modulator 4GP. The light modulation unit 4B includes a light modulator 4BP.

The light source 2 emits, to the color separation optical system 3, illumination light WL adjusted to have a substantially uniform illuminance distribution. The light source 2 is, for example, a semiconductor laser. The color separation optical system 3 separates the illumination light WL emitted from the light source 2 into red light LR, green light LG, and blue light LB. The color separation optical system 3 includes a first dichroic mirror 7a, a second dichroic mirror 7b, a first reflection mirror 8a, a second reflection mirror 8b, a third reflection mirror 8c, and a relay lens 8d.

The first dichroic mirror 7a separates the illumination light WL emitted from the light source 2 into the red light LR and mixed light of the green light LG and the blue light LB. The first dichroic mirror 7a has a characteristic of transmitting the red light LR and reflecting the green light LG and the blue light LB. The second dichroic mirror 7b separates the mixed light of the green light LG and the blue light LB into the green light LG and the blue light LB. The second dichroic mirror 7b has a characteristic of reflecting the green light LG and transmitting the blue light LB.

The first reflection mirror 8a is disposed in an optical path of the red light LR and reflects the red light LR transmitted through the first dichroic mirror 7a to the light modulator 4RP. The second reflection mirror 8b and the third reflection mirror 8c are disposed in an optical path of the blue light LB and guide the blue light LB transmitted through the second dichroic mirror 7b to the light modulator 4BP.

Each of the light modulator 4RP, the light modulator 4GP, and the light modulator 4BP is configured from a liquid crystal panel. The light modulator 4RP modulates, according to an image signal, the red light LR in the light emitted from the light source 2. The light modulator 4GP modulates, according to an image signal, the green light LG in the light emitted from the light source 2. The light modulator 4BP modulates, according to an image signal, the blue light LB in the light emitted from the light source 2. Consequently, the light modulators 4RP, 4GP, and 4BP form image lights corresponding to the color lights. Although not illustrated, polarizing plates are disposed on a light incident side and a light emission side of each of the light modulators 4RP, 4GP, and 4BP.

A field lens 9R that parallelizes the red light LR made incident on the light modulator 4RP is disposed on the light incident side of the light modulator 4RP. A field lens 9G that parallelizes the green light LG made incident on the light modulator 4GP is disposed on the light incident side of the light modulator 4GP. A field lens 9B that parallelizes the blue light LB made incident on the light modulator 4BP is disposed on the light incident side of the light modulator 4BP.

The light combination optical system 5 is configured from a cross dichroic prism having a substantially cubic shape. The light combination optical system 5 combines the image lights corresponding to the colors emitted from the light modulators 4RP, 4GP, and 4BP. The light combination optical system 5 emits combined image light to the projection optical device 6. The projection optical device 6 is configured from a projection lens group. The projection optical device 6 enlarges and projects the image light combined by the light combination optical system 5, that is, light modulated by the light modulators 4RP, 4GP, and 4BP toward a screen SCR. Consequently, an enlarged color image (video) is displayed on the screen SCR.

As shown in FIG. 2, the projector 1 further includes a first cooling device 10. The first cooling device 10 cools a first cooling target included in the projector 1 based on transformation of a refrigerant W into gas. In this embodiment, the refrigerant W is, for example, liquid water. Accordingly, in the following explanation, the refrigerant W changing to gas is sometimes simply referred to as vaporization. In this embodiment, the first cooling target includes the light modulation units 4R, 4G, and 4B. That is, in this embodiment, the first cooling target includes the light modulators 4RP, 4GP, and 4BP.

The first cooling device 10 includes a refrigerant generator 20 and a refrigerant sender 50. The refrigerant generator 20 is a portion that generates the refrigerant W. The refrigerant sender 50 is a portion that transfers the generated refrigerant W to the first cooling target. Heat can be taken from the first cooling target when the refrigerant W sent to the first cooling target, that is, in this embodiment, the light modulation units 4R, 4G, and 4B by the refrigerant sender 50 vaporizes. The first cooling device 10 can cool the first cooling target. The sections are explained in detail below.

Figure 3:
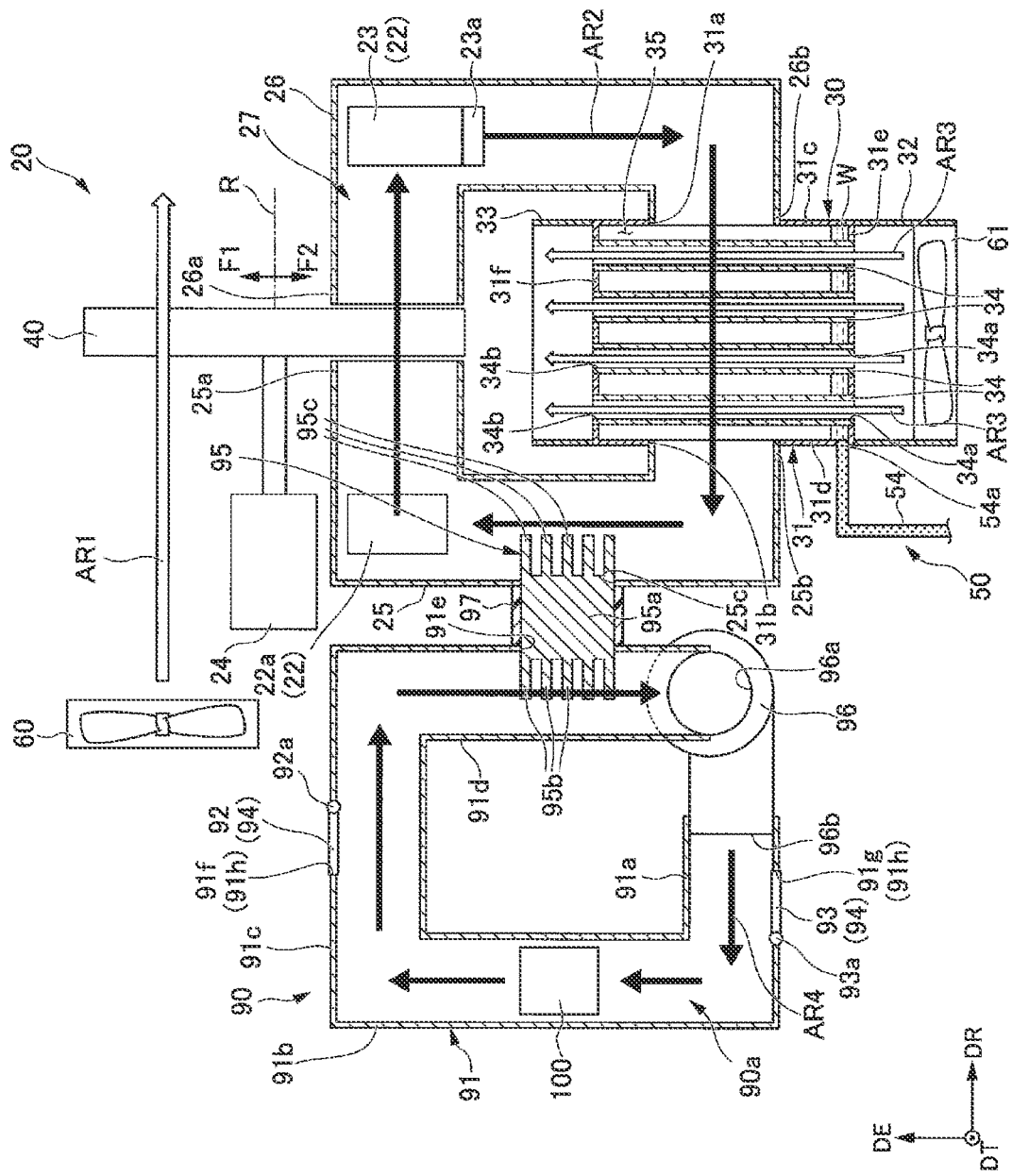
FIG. 3 is a schematic configuration diagram schematically showing a refrigerant generator and a second cooling device in the first embodiment.

FIG. 3 is a schematic configuration diagram schematically showing the refrigerant generator 20 and a second cooling device 90 explained below in this embodiment. The refrigerant generator 20 includes, as shown in FIG. 3, a moisture absorbing and desorbing member 40, a motor (a driving section) 24, a first blower 60, a heat exchanger 30, a circulation duct 25, a circulation duct 26, a heater 22, a second blower 23, a fourth blower 61.

Figure 4:
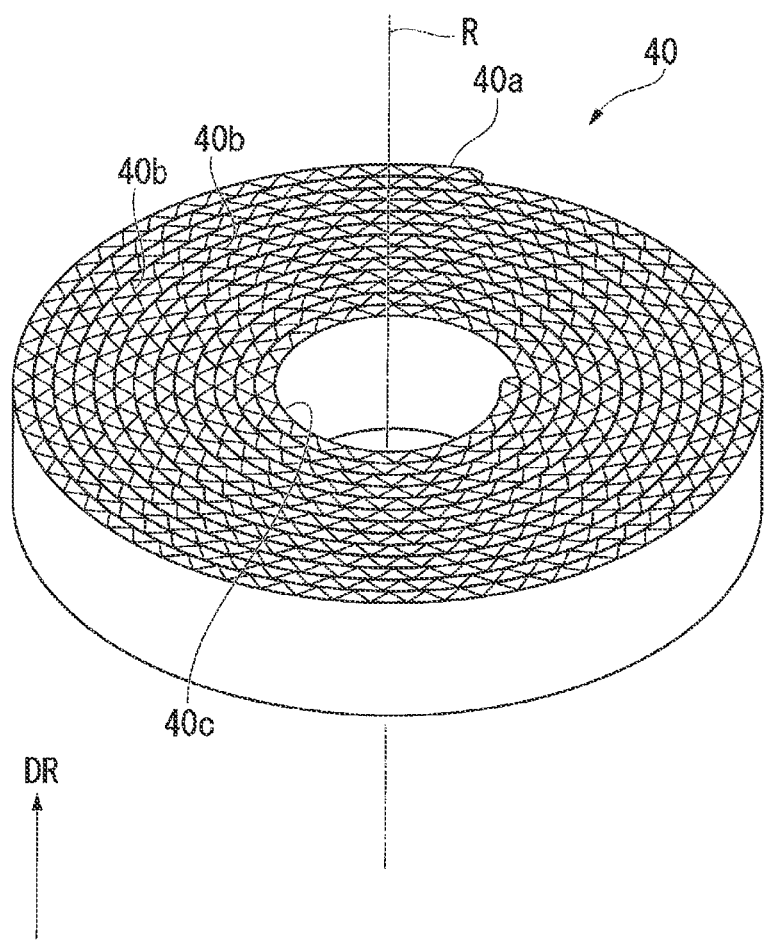
FIG. 4 is a perspective view showing a moisture absorbing and desorbing member in the first embodiment.

FIG. 4 is a perspective view showing the moisture absorbing and desorbing member 40. As shown in FIG. 4, the moisture absorbing and desorbing member 40 has a flat columnar shape centering on a rotation axis R. A center hole 40c centering on the rotation axis R is formed in the center of the moisture absorbing and desorbing member 40. The center hole 40c pierces through the moisture absorbing and desorbing member 40 in the axial direction of the rotation axis R. The moisture absorbing and desorbing member 40 rotates around the rotation axis R. In the following explanation, the axial direction of the rotation axis R is referred to as "rotation axis direction DR" and indicated by a DR axis in the figures as appropriate.

The moisture absorbing and desorbing member 40 includes innumerable through-holes 40b that pierce through the moisture absorbing and desorbing member 40 in the rotation axis direction DR. The moisture absorbing and desorbing member 40 is a porous member. The moisture absorbing and desorbing member 40 has a moisture absorbing and desorbing property. In this embodiment, the moisture absorbing and desorbing member 40 is made by, for example, winding a belt-like member 40a, which includes the through-holes 40b, around the rotation axis R and applying a substance having the moisture absorbing and desorbing property to surfaces exposed to the outside in the wound belt-like member 40a. The surfaces exposed to the outside in the wound belt-like member 40a include the outer surface of the moisture absorbing and desorbing member 40, the inner circumferential surface of the center hole 40c, and the inner side surfaces of the through-holes 40b. The entire moisture absorbing and desorbing member 40 is made of a substance having the moisture absorbing and desorbing property. Examples of the substance having the moisture absorbing and desorbing property include zeolite and silica gel.

An output shaft of the motor 24 shown in FIG. 3 is inserted into the center hole 40c of the moisture absorbing and desorbing member 40 and fixed. The motor 24 rotates the moisture absorbing and desorbing member 40 around the rotation axis R. Rotating speed of the moisture absorbing and desorbing member 40 rotated by the motor 24 is, for example, approximately 0.2 rpm or more and 5 rpm or less.

The first blower 60 is, for example, an intake fan that takes outside air into the projector 1. The first blower 60 sends air AR1 to a portion of the moisture absorbing and desorbing member 40 located in a first region F1. The first region F1 is a region further on one side than the rotation axis R in a direction orthogonal to the rotation axis R. On the other hand, a region further on the other side than the rotation axis R in the direction orthogonal to the rotation axis R, that is, a region on the opposite side of the first region F1 with respect to the rotation axis R is a second region F2. In FIG. 3, the first region F1 is a region further on the upper side than the rotation axis R. In FIG. 3, the second region F2 is a region further on the lower side than the rotation axis R.

As shown in FIG. 2, the first blower 60 sends the air AR1 to the light modulation units 4R, 4G, and 4B, which are the first cooling target. That is, in this embodiment, the first blower 60 is a cooling air blower that sends the air AR1 to the first cooling target. The first blower 60 is not particularly limited if the first blower 60 can send the air AR1. The first blower 60 may be, for example, an axial fan or may be a centrifugal fan.

Figure 5:
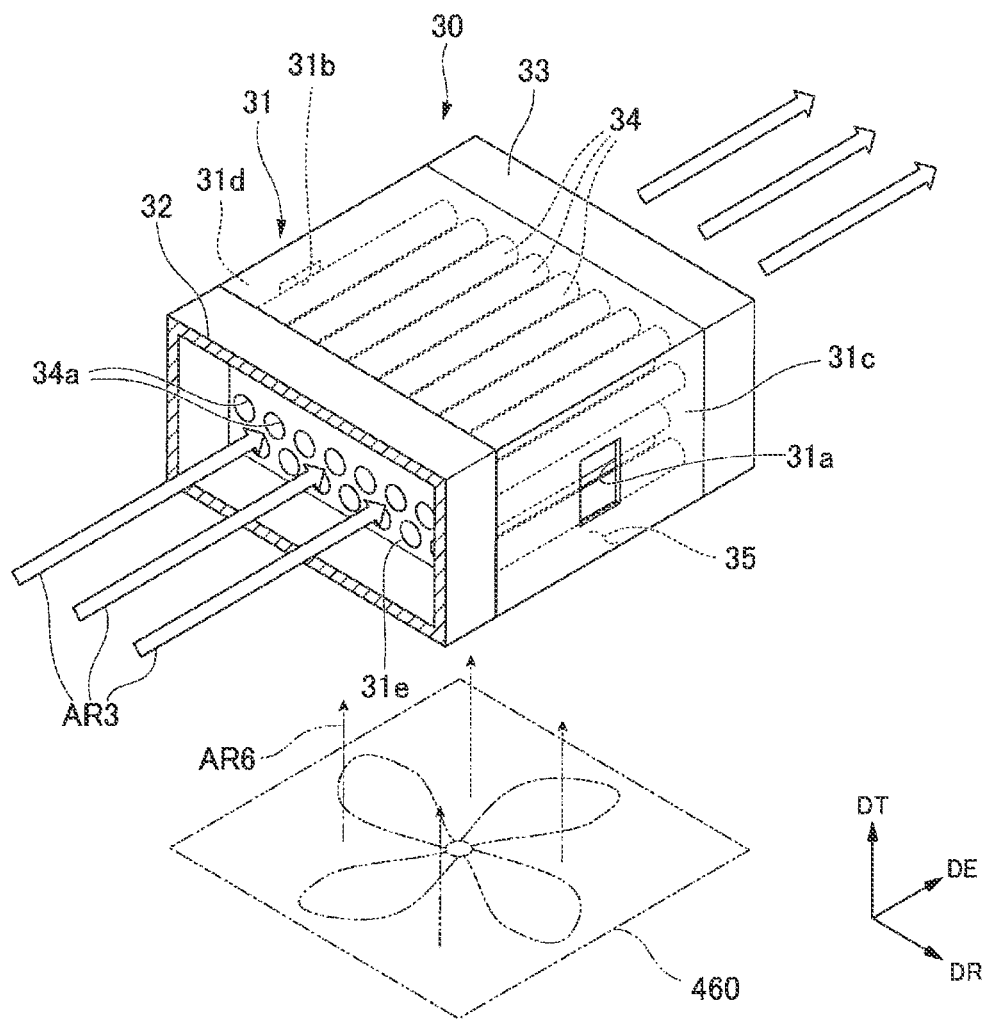
FIG. 5 is a partial sectional perspective view showing a heat exchanger in the first embodiment.

The heat exchanger 30 is a portion in which the refrigerant W is generated. FIG. 5 is a partial sectional perspective view showing the heat exchanger 30. As shown in FIG. 5, the heat exchanger 30 includes a housing 31, a plurality of channel sections 34, an inflow duct 32, and an outflow duct 33.

In this embodiment, the housing 31 has a rectangular parallelepiped box shape. The housing 31 includes an internal space 35, an inflow hole section 31a, and an outflow hole section 31b. The air sent by the second blower 23 flows into the internal space 35. The inflow hole section 31a is provided in a sidewall section 31c on one side (a +DR side) in the rotation axis direction DR in the housing 31. The outflow hole section 31b is provided in a sidewall section 31d on the other side (a −DR side) in the rotation axis direction DR in the housing 31. The inflow hole section 31a and the outflow hole section 31b are connected to the internal space 35. The inflow hole section 31a and the outflow hole section 31b have, for example, a rectangular shape. In this embodiment, the inflow hole section 31a and the outflow hole section 31b overlap each other when viewed along the rotation axis direction DR.

The plurality of channel sections 34 are disposed in the internal space 35. The air sent by the fourth blower 61 circulates on the insides of the plurality of channel sections 34. In this embodiment, the plurality of channel sections 34 are linearly extending conduits. The channel sections 34 have, for example, a cylindrical shape. The channel sections 34 are opened on both sides in an extending direction. The plurality of channel sections 34 extend in, for example, directions parallel to one another. For example, the direction in which the channel sections 34 extend is orthogonal to the rotation axis direction DR. In the following explanation, the direction in which the channel sections 34 extend is referred to as "extending direction DE" and indicated by a DE axis in the figures as appropriate. The first region F1 and the second region F2 are divided based on the rotation axis R in the extending direction DE orthogonal to the rotation axis direction DR.

In this specification, "a plurality of channel sections extend in directions parallel to one another" includes a case in which a plurality of channel sections extend in directions substantially parallel to one another in addition to a case in which a plurality of channel sections extend in directions strictly parallel to one another. "A plurality of channel sections extend in directions substantially parallel to one another" includes, for example, a case in which an angle formed by the channel sections is approximately 10° or less.

In this specification, a plurality of rows arranged along the rotation axis direction DR of the channel sections 34 are provided in a plurality of rows along a direction orthogonal to both of the rotation axis direction DR and the extending direction DE. In the following explanation, the direction orthogonal to both of the rotation axis direction DR and the extending direction DE is referred to as "thickness direction DT" and indicated by a DT axis in the figures as appropriate. The plurality of channel sections 34 form, for example, four rows arranged in the thickness direction DT. The channel sections 34 included in one row of rows adjacent to each other in the thickness direction DT are located between the channel sections 34 included in the other row in the rotation axis direction DR. That is, the plurality of channel sections 34 are disposed in zigzag when viewed along the extending direction DE.

As shown in FIG. 3, the channel sections 34 extend from a sidewall section 31e on the other side (a −DE side) in the extending direction DE in the housing 31 to a sidewall section 31f on one side (a +DE side) in the extending direction DE in the housing 31. The end portions on the other side (the −DE side) in the extending direction DE in the channel sections 34 are inflow ports 34a opened in a surface on the other side in the extending direction DE in the sidewall section 31e and opened to the outside of the housing 31. The end portions on one side (the +DE side) in the extending direction DE in the channel sections 34 are outflow ports 34b opened in a surface on one side in the extending direction DE in the sidewall section 31f and opened to the outside of the housing 31. Consequently, the channel sections 34 connect spaces located on both sides in the extending direction DE of the housing 31. On the other hand, the insides of the plurality of channel sections 34 are not connected to the internal space 35. Consequently, air circulating on the insides of the plurality of channel sections 34 and air fed into the internal space 35 are not mixed. That is, the insides of the plurality of channel sections 34 are separated from the internal space 35.

The inflow duct 32 and the outflow duct 33 are ducts extending in the extending direction DE. In this embodiment, the inflow duct 32 and the outflow duct 33 have a rectangular tube shape. The inflow duct 32 and the outflow duct 33 are disposed across the housing 31 in the extending direction DE and are respectively coupled to the housing 31. The inflow duct 32 is located on the other side (the −DE side) in the extending direction DE of the housing 31. The outflow duct 33 is located on one side (the +DE side) in the extending direction DE of the housing 31.

The end portion on one side (the +DE side) in the extending direction DE in the inflow duct 32 is fixed to the outer peripheral edge portion of the sidewall section 31e and closed by the sidewall section 31e. The inflow ports 34a of the plurality of channel sections 34 are opened on the inside of the inflow duct 32. Consequently, the inside of the inflow duct 32 is connected to the insides of the plurality of channel sections 34 via the inflow ports 34a.

The end portion on the other side (the −DE side) in the extending direction DE in the outflow duct 33 is fixed to the outer peripheral edge portion of the sidewall section 31f and closed by the sidewall section 31f. The outflow ports 34b of the plurality of channel sections 34 are opened on the inside of the outflow duct 33. Consequently, the inside of the outflow duct 33 is connected to the insides of the plurality of channel sections 34 via the outflow ports 34b.

The circulation duct 26 is a duct disposed on one side (the +DR side) of the moisture absorbing and desorbing member 40 in the rotation axis direction DR. The circulation duct 26 extends from one side in the rotation axis direction DR of the moisture absorbing and desorbing member 40 to one side in the rotation axis direction DR of the housing 31. One end portion 26a of the circulation duct 26 is opened on the other side (the −DR side) in the rotation axis direction DR toward a portion of the moisture absorbing and desorbing member 40 located in the second region F2. The other end portion 26b of the circulation duct 26 is connected to the inflow hole section 31a of the housing 31 and opened in the internal space 35. Consequently, the inside of the circulation duct 26 is connected to the internal space 35.

The circulation duct 25 is a duct disposed on the other side (the −DR side) of the moisture absorbing and desorbing member 40 in the rotation axis direction DR. The circulation duct 25 extends from the other side in the rotation axis direction DR of the moisture absorbing and desorbing member 40 to the other side in the rotation axis direction DR of the housing 31. One end portion 25a of the circulation duct 25 is opened on one side (the +DR side) in the rotation axis direction DR toward the portion of the moisture absorbing and desorbing member 40 located in the second region F2. The other end portion 25b of the circulation duct 25 is connected to the outflow hole section 31b of the housing 31 and opened in the internal space 35. Consequently, the inside of the circulation duct 25 is connected to the internal space 35. The circulation duct 25 includes a through-hole 25c that pierces through a wall section of the circulation duct 25. The through-hole 25c is provided in, for example, a wall section located on the other side in the rotation axis direction DR in the wall section forming the circulation duct 25.

The heater 22 includes a heating main body 22a. The heating main body 22a is disposed on the inside of the circulation duct 25. The heating main body 22a is disposed on the other side (the −DR side) of the portion of the moisture absorbing and desorbing member 40 located in the second region F2 in the rotation axis direction DR. The heating main body 22a is, for example, an electric heater. The heating main body 22a heats atmosphere (air) on the inside of the circulation duct 25. In this embodiment, the heater 22 includes the second blower 23.

The second blower 23 is disposed on the inside of the circulation duct 26. The second blower 23 is disposed on one side (the +DR side) of the portion of the moisture absorbing and desorbing member 40 located in the second region F2 in the rotation axis direction DR. The second blower 23 is, for example, a centrifugal fan. The second blower 23 emits, from an exhaust port 23a, to the other side (the −DE side) in the extending direction, air taken in from the other side (the −DR side) in the rotation axis direction DR. The air emitted from the exhaust port 23a flows into the internal space 35 of the housing 31 via the inflow hole section 31a. That is, the second blower 23 sends the air to the internal space 35 via the inflow hole section 31a. The second blower 23 may be, for example, an axial fan.

The air emitted to the internal space 35 from the second blower 23 is air taken in from the other side (the −DR side) in the rotation axis direction DR of the second blower 23 via one end portion 26a of the circulation duct 26 and is air passed through the portion of the moisture absorbing and desorbing member 40 located in the second region F2. That is, the second blower 23 causes the air to pass through the portion of the moisture absorbing and desorbing member 40 located in the second region F2 different from the first region F1 and sends the air to the heat exchanger 30. The air before passing through the portion of the moisture absorbing and desorbing member 40 located in the second region F2 in this embodiment flows on the inside of the circulation duct 25. Accordingly, the heating main body 22a heats the air before passing through the portion of the moisture absorbing and desorbing member 40 located in the second region F2.

In this way, in this embodiment, the heater 22 sends, with the second blower 23, the air heated by the heating main body 22a to the portion of the moisture absorbing and desorbing member 40 located in the second region F2 to heat the portion of the moisture absorbing and desorbing member 40 located in the second region F2. Consequently, the second blower 23 sends the air around the portion heated by the heater 22 in the moisture absorbing and desorbing member 40 to the heat exchanger 30.

The air flowing into the internal space 35 of the heat exchanger 30 from the second blower 23 passes through the internal space 35 in the rotation axis direction DR and flows into the inside of the circulation duct 25 via the outflow hole section 31b. The air flowing into the inside of the circulation duct 25 is heated by the heating main body 22a, passes through the portion of the moisture absorbing and desorbing member 40 located in the second region F2 again, flows into the inside of the circulation duct 26, and is sucked by the second blower 23.

As explained above, in this embodiment, the refrigerant generator 20 includes a refrigerant generation path 27 in which the air emitted from the second blower 23 circulates. The refrigerant generation path 27 is configured by at least the circulation ducts 25 and 26 and the heat exchanger 30. The refrigerant generation path 27 passes the heating main body 22a, the moisture absorbing and desorbing member 40, and the internal space 35 of the heat exchanger 30. Gaps are slightly provided between the moisture absorbing and desorbing member 40 and the circulation ducts 25 and 26. However, the refrigerant generation path 27 is substantially sealed. Outdoor air is suppressed from flowing into the inside of the refrigerant generation path 27. In the following explanation, the air emitted from the second blower 23 and circulating in the refrigerant generation path 27 is referred to as air AR2.

In this embodiment, the fourth blower 61 is disposed on the inside of the inflow duct 32. The fourth blower 61 may be an axial fan or may be a centrifugal fan. The fourth blower 61 emits cooling air AR3 to one side (the +DE side) in the extending direction DE in the inflow duct 32. The emitted cooling air AR3 flows into the insides of the channel sections 34 via the inflow ports 34a. That is, in this embodiment, the fourth blower 61 sends the cooling air AR3 to the insides of the plurality of channel sections 34 from the inflow ports 34a via the inflow duct 32. Consequently, the cooling air AR3 circulates on the insides of the plurality of channel sections 34. The cooling air AR3 passing through the insides of the channel sections 34 cools the air AR2 in the internal space 35 via the channel sections 34. In this way, by sending the cooling air AR3 to the insides of the channel sections 34, the fourth blower 61 can cool the air AR2 fed into the internal space 35 via the channel sections 34. The cooling air AR3 sent into the insides of the channel sections flows out to the inside of the outflow duct 33 from the outflow ports 34b.

When the air AR1 is sent to the portion of the moisture absorbing and desorbing member 40 located in the first region F1 from the first blower 60, water vapor included in the air AR1 is absorbed by the portion of the moisture absorbing and desorbing member 40 located in the first region F1. The portion of the moisture absorbing and desorbing member 40, which has absorbed the water vapor, moves from the first region F1 to the second region F2 when the moisture absorbing and desorbing member 40 is rotated by the motor 24. The air AR2 having relatively high temperature heated by the heating main body 22a passes through the portion of the moisture absorbing and desorbing member 40 located in the second region F2. Consequently, moisture absorbed by the moisture absorbing and desorbing member 40 vaporizes and is desorbed to the air AR2.

The air AR2 including the water vapor absorbed from the air AR1 by passing through the moisture absorbing and desorbing member 40 is sent to the internal space 35 of the heat exchanger 30 by the second blower 23. The air AR2 having relatively high temperature sent to the internal space 35 circulates in the internal space 35 in the direction crossing the extending direction DE of the plurality of channel sections 34 and is cooled by the cooling air AR3 passing through the insides of the plurality of channel sections 34. Consequently, the water vapor included in the air AR2 condenses to be liquid water, that is, the refrigerant W. In this way, in the housing 31 of the heat exchanger 30, that is, in the internal space 35, the refrigerant W is generated from the air AR2 flowing into the internal space 35 when the air AR2 flowing into the internal space 35 is cooled by the cooling air AR3 sent to the insides of the plurality of channel sections 34.

In this embodiment, the refrigerant sender 50 is made of a porous member and transfers the refrigerant W with the capillary phenomenon. Examples of the material of the refrigerant sender 50 include polypropylene, cotton, and porous metal. The material of the refrigerant sender 50 is preferably a material that can set the surface tension of the refrigerant sender 50 relatively large.

Figure 6:
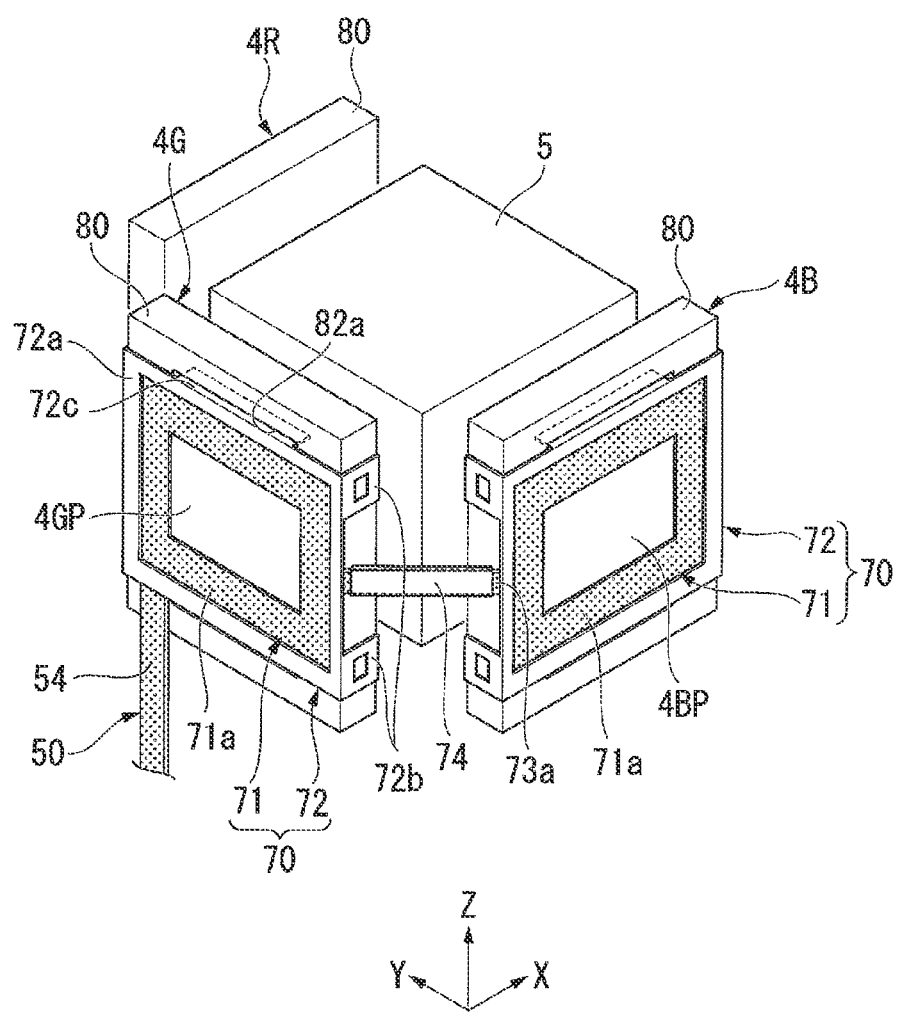
FIG. 6 is a perspective view showing a light modulation unit and a light combination optical system in the first embodiment.

The refrigerant sender 50 includes a connecting section 54 connected to the housing 31. The connecting section 54 is a portion connecting the housing 31 and the first cooling target. Since the refrigerant sender 50 is made of the porous member in this embodiment as explained above, the connecting section 54 is made of a porous member. An end portion 54a connected to the housing 31 in the connecting section 54 is exposed to the internal space 35. The connecting section 54 pierces through the sidewall section 31d of the housing 31 and projects to the outside of the housing 31 from the internal space 35 of the housing 31. The connecting section 54 has a thin belt shape. As shown in FIG. 6, the connecting section 54 projecting to the outside of the housing 31 extends to the light modulation unit 4G, which is the first cooling target. FIG. 6 is a perspective view showing the light modulation units 4R, 4G, and 4B and the light combination optical system 5.

The light modulation units 4R, 4G, and 4B, which are the first cooling target in this embodiment, are explained more in detail. In the following explanation, an up-down direction A, a positive side of which is the upper side and a negative side of which is the lower side, is indicated by a Z axis in the figures as appropriate. A direction parallel to an optical axis AX of a projection lens on the most light emission side in the projection optical device 6, that is, a direction parallel to a projecting direction of the projection optical device 6 is referred to as "optical axis direction X" and is indicated by an X axis in the figures as appropriate. The optical axis direction X is orthogonal to the up-down direction A. A direction orthogonal to both of the optical axis direction X and the up-down direction Z is referred to as "width direction Y" and is indicated by a Y axis in the figures as appropriate.

The up-down direction Z and the upper side and the lower side are simply names for explaining relative positional relations among the sections. Actual disposition relations and the like may be disposition relations and the like other than the disposition relations and the like indicated by these names.

Figure 7:
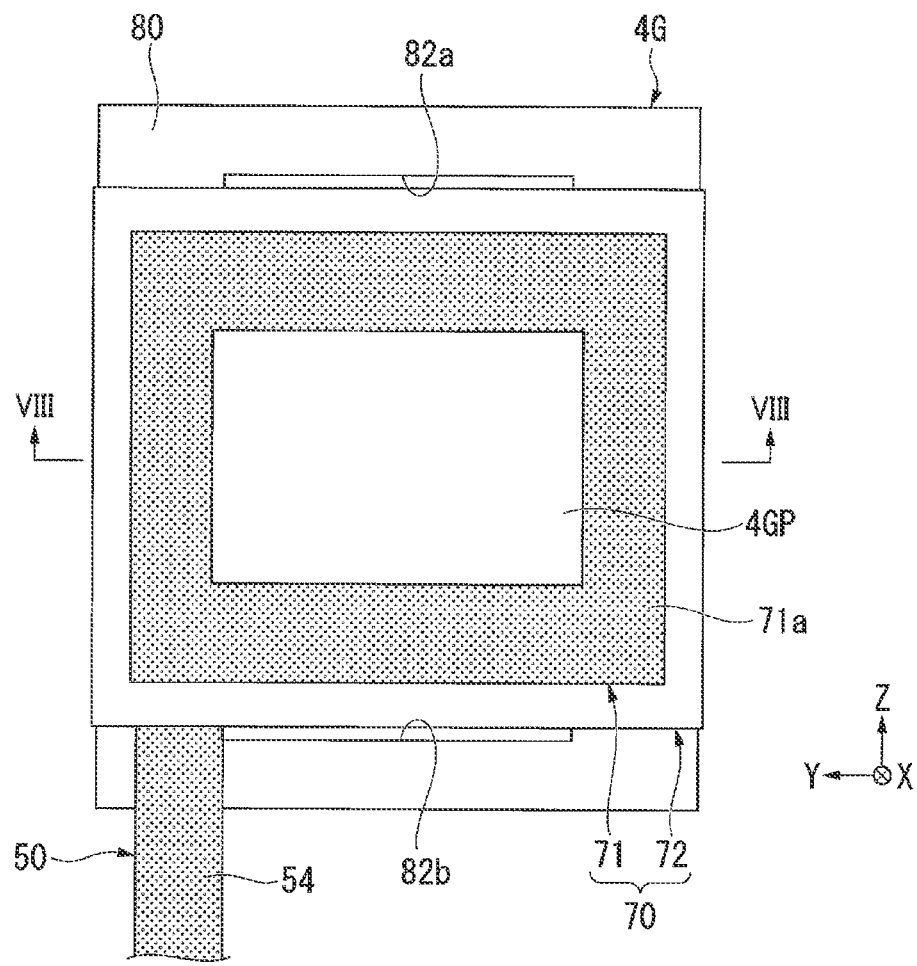
FIG. 7 is a diagram of the light modulation unit in the first embodiment viewed from a light incident side.
Figure 8:
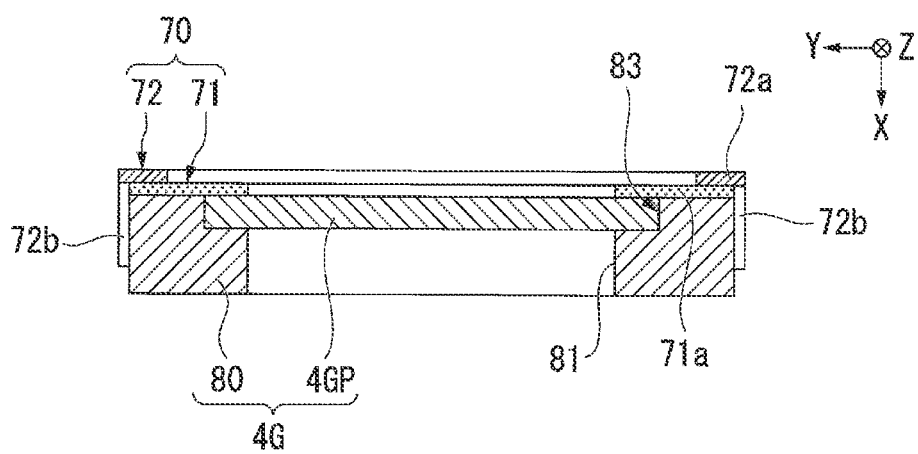
FIG. 8 is a diagram showing the light modulation unit in the first embodiment and is a VIII-VIII sectional view in FIG. 7.

FIG. 7 is a diagram of the light modulation unit 4G viewed from the light incident side. FIG. 8 is a diagram showing the light modulation unit 4G and is a VIII-VIII sectional view in FIG. 7.

The light modulation unit 4R, the light modulation unit 4G, and the light modulation unit 4B, which are the first cooling target, are disposed to surround the light combination optical system 5 as shown in FIG. 6. The light modulation unit 4R and the light modulation unit 4B are disposed on opposite sides each other across the light combination optical system 5 in the width direction Y. The light modulation unit 4G is disposed on the light incident side (a −X side) in the optical axis direction X of the light combination optical system 5. The structure of the light modulation unit 4R, the light modulation unit 4G, and the structure of the light modulation unit 4B are the same except that positions where the light modulation units 4R, 4G, and 4B are disposed and postures of the light modulation units 4R, 4G, and 4B are different. Therefore, in the following explanation, only the light modulation unit 4G is sometimes representatively explained.

The light modulation unit 4G includes a holding frame 80 that holds the light modulator 4GP. As shown in FIGS. 6 to 8, the holding frame 80 has a substantially rectangular parallelepiped shape flat in a direction in which light is made incident on the light modulator 4GP and long in the up-down direction Z. The direction in which light is made incident on the light modulator 4GP is, for example, the optical axis direction X.

The holding frame 80 includes, as shown in FIG. 8, a through-hole 81 that pierces through the holding frame 80 in the direction in which light is made incident. A step section 83, where the width of the through-hole 81 increases, is provided at the edge on the light incident side (the −X side) of the through-hole 81. The light modulator 4GP is fit in the step section 83 and held by the holding frame 80. As shown in FIG. 7, insertion grooves 82a and 82b are formed in portions on both sides in the up-down direction Z on the surface on the light incident side of the holding frame 80.

The projector 1 further includes, as shown in FIGS. 6 to 8, a cooling facilitator 70 provided in the light modulation unit 4G, which is the first cooling target. The cooling facilitator 70 includes a refrigerant holding section 71 and a fixing member 72. The refrigerant holding section 71 is attached to the surface of holding frame 80 of the light modulation unit 4G, which is the first cooling target. In this embodiment, the refrigerant holding section 71 is provided on the surface on the light incident side (the −X side) of the light modulator 4GP in the holding frame 80. The refrigerant holding section 71 is made of a porous member that holds the refrigerant W. Examples of the material of the refrigerant holding section 71 include polypropylene, cotton, and porous metal. The material of the refrigerant holding section 71 can be the same as, for example, the material of the refrigerant sender 50. The material of the refrigerant holding section 71 is preferably a material that can set the surface tension of the refrigerant holding section 71 relatively large.

Figure 9:
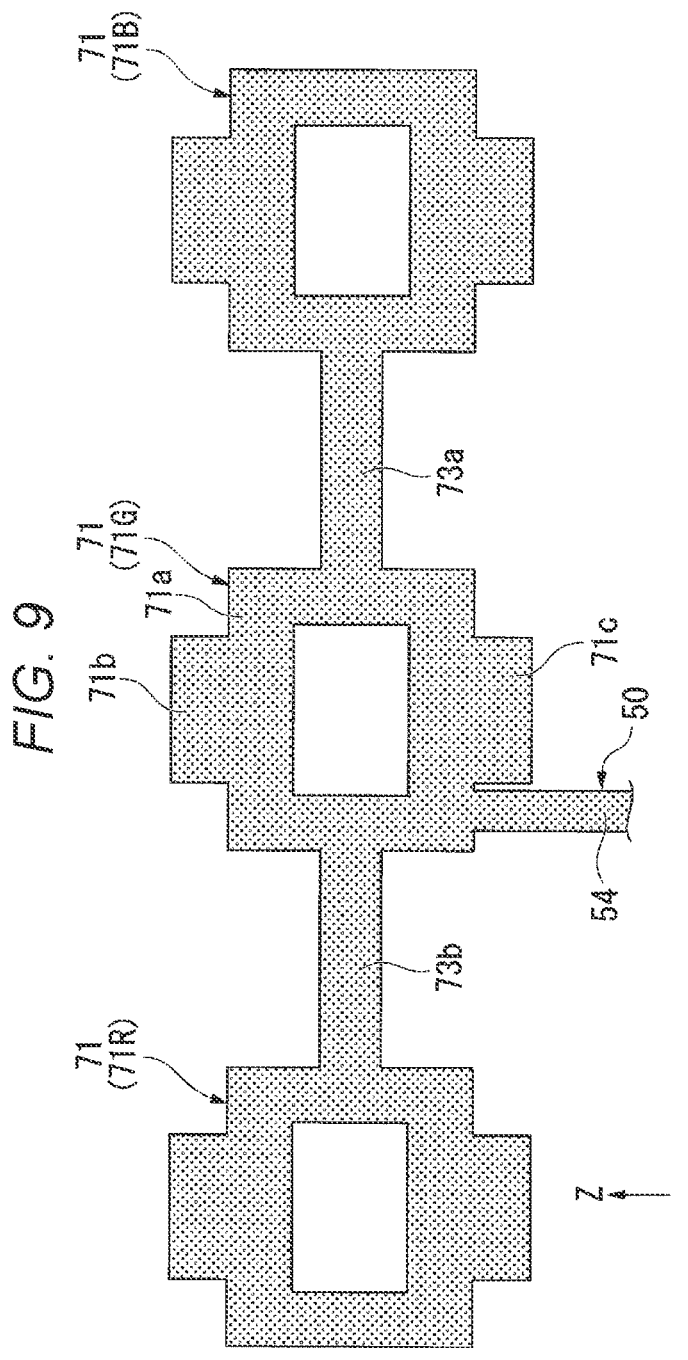

FIG. 9 is a diagram showing the refrigerant holding section 71. The refrigerant holding section 71 includes, as shown in FIG. 9, a rectangular frame-like main body 71a and inserting sections 71b and 71c provided at the end portions on both the sides in the up-down direction Z in the main body 71a. As shown in FIG. 8, the main body 71a covers a part of the surface on the light incident side (the −X side) of the light modulator 4GP in the holding frame 80. A portion on the inner edge side in the main body 71a covers the outer edge portion of the light modulator 4GP. The inserting section 71b is bent and inserted into the insertion groove 82a of the holding frame 80. The inserting section 71c is bent and inserted into the insertion groove 82b of the holding frame 80.

The fixing member 72 is a member that fixes the refrigerant holding section 71. The fixing member 72 is a tabular member as shown in FIGS. 6 and 8. The fixing member 72 is made of, for example, metal. The fixing member 72 includes a rectangular frame-like frame section 72a, attachment sections 72b, and inserting sections 72c. As shown in FIGS. 7 and 8, the frame section 72a covers the outer edge portion of the refrigerant holding section 71. The holding frame 80, the refrigerant holding section 71, and the frame section 72a are superimposed one on top of another in the direction of light passing through the light modulation unit 4G (the optical axis direction X). In the following explanation, a direction in which the holding frame 80, the refrigerant holding section 71, and the frame section 72a are superimposed one on top of another is simply referred to as "superimposing direction". The fixing member 72 holds and fixes, with the frame section 72a, the refrigerant holding section 71 in the superimposing direction (the optical axis direction X) between the fixing member 72 and the holding frame 80.

The inner edge of the frame section 72a is provided further on the outer side than the inner edge of the refrigerant holding section 71. Accordingly, a part of the refrigerant holding section 71, that is, in this embodiment, a portion further on the inner side than the frame section 72a is exposed when viewed from the fixing member 72 side in the superimposing direction.

As shown in FIGS. 6 and 8, the attachment sections 72b are respectively provided at both the end portions in the width direction Y at both the end portions in the up-down direction Z of the frame section 72a. The attachment sections 72b project to the holding frame 80 side (a +X side) from the frame section 72a. The attachment sections 72b are engaged with protrusions provided on a side surface of the holding frame 80. Consequently, the fixing member 72 is fixed to the holding frame 80.

The inserting sections 72c are provided at both the end portions in the up-down direction Z of the frame section 72a. The inserting sections 72c project to the holding frame 80 side (the +X side) from the frame section 72a. The inserting sections 72c are inserted into the insertion grooves 82a and 82b of the holding frame 80. The inserting sections 72c press the inserting sections 71b and 71c of the refrigerant holding section 71 on the insides of the insertion grooves 82a and 82b.

The refrigerant facilitator 70 is provided in each of the plurality of light modulation units 4R, 4G, and 4B. That is, the refrigerant holding section 71 and the fixing member 72 are provided in each of the plurality of light modulation units 4R, 4G, and 4B. As shown in FIG. 9, a refrigerant holding section 71G provided in the light modulation unit 4G among the light modulation units 4R, 4G, and 4B is connected to the refrigerant sender 50. More specifically, the connecting section 54 of the refrigerant sender 50 is connected to the lower end portion of the refrigerant holding section 71G.

A refrigerant holding section 71B attached to the light modulation unit 4B and a refrigerant holding section 71R attached to the light modulation unit 4R are the same as the refrigerant holding section 71G attached to the light modulation unit 4G except that the connecting section 54 is not connected to the refrigerant holding section 71B and the refrigerant holding section 71R.

In this embodiment, coupling sections 73a and 73b made of a porous member that couple the refrigerant holding sections 71, which are provided in the plurality of light modulation units 4R, 4G, and 4B, to one another are provided. In this embodiment, the refrigerant holding section 71B attached to the light modulation unit 4B and the refrigerant holding section 71R attached to the light modulation unit 4R are coupled to, via the coupling sections 73a and 73b, both sides of the refrigerant holding section 71G attached to the light modulation unit 4G.

The coupling section 73a couples the refrigerant holding section 71G attached to the light modulation unit 4G and the refrigerant holding section 71B attached to the light modulation unit 4B. Consequently, the refrigerant holding section 71B is connected to the connecting section 54 of the refrigerant sender 50 via the refrigerant holding section 71G. As shown in FIG. 6, a covering section 74 covering the coupling section 73a is provided in the coupling section 73a. The covering section 74 is, for example, a film made of resin.

The coupling section 73b couples the refrigerant holding section 71 attached to the light modulation unit 4G and the refrigerant holding section 71 attached to the light modulation unit 4R. Consequently, the refrigerant holding section 71R is connected to the connecting section 54 of the refrigerant sender 50 via the refrigerant holding section 71G. Although not illustrated, the covering section 74 is provided in the coupling section 73b as in the coupling section 73a.

The refrigerant W generated by the refrigerant generator 20 is transferred to the refrigerant holding section 71G by the connecting section 54 of the refrigerant sender 50. The refrigerant W transferred to the refrigerant holding section 71G is transferred to the refrigerant holding section 71B via the coupling section 73a and transferred to the refrigerant holding section 71R via the coupling section 73b. In this way, the refrigerant W generated by the refrigerant generator 20 is transferred to the three light modulation units 4R, 4G, and 4B. The light modulation units 4R, 4G, and 4B, which are the first cooling target, are cooled as the refrigerant W transferred and held by the refrigerant holding section 71 vaporizes. More specifically, the holding frame 80 to which the refrigerant holding section 71 is attached is cooled as the refrigerant W held by the refrigerant holding section 71 vaporizes. The light modulators 4RP, 4GP, and 4BP held by the holding frame 80 are cooled as the holding frame 80 is cooled. Consequently, the light modulators 4RP, 4GP, and 4BP, which are the first cooling target, can be cooled by the first cooling device 10.

The projector 1 further includes, as shown in FIG. 3, a second cooling device 90, a heat conduction member 95, a heat insulating member 97, and a second cooling target. The second cooling device 90 sends air AR4 to the second cooling target different from the first cooling target to cool the second cooling target. In this embodiment, the second cooling target is a power supply device 100 included in the projector 1. The power supply device 100 is a device that supplies, to the sections of the projector 1, electric power supplied from an external power supply connected to the projector 1.

The second cooling device 90 includes a third blower 96 and a circulation duct 91. The third blower 96 is, for example, a centrifugal fan. The third blower 96 includes an intake port 96a and an exhaust port 96b. The third blower 96 sucks the air AR4 from the intake port 96a and discharges the air AR4 from the exhaust port 96b. The air AR4 discharged from the exhaust port 96b is sent to the power supply device 100. That is, the third blower 96 sends the air AR4 to the power supply device 100, which is the second cooling target. In FIG. 3, the air AR4 is discharged to the other side (the −DR side) in the rotation axis direction DR from the exhaust port 96b. The third blower 96 may be an axial fan.

The circulation duct 91 is a duct in which the air AR4 sent from the third blower 96 circulates. In FIG. 3, the circulation duct 91 is disposed side by side with and spaces apart from the circulation duct 25 on the other side (the −DR side) in the rotation axis direction DR. On the inside of the circulation duct 91, at least a part of the power supply device 100 is disposed. On the inside of the circulation duct 91, the entire power supply device 100 may be disposed or only a part of the power supply device 100 may be disposed.

One end portion of the circulation duct 91 is connected to the exhaust port 96*b* of the third blower 96. The other end portion of the circulation duct 91 is connected to the intake port 96*a* of the third blower 96. Consequently, the air AR4 sucked from the intake port 96*a* and discharged from the exhaust port 96*b* circulates on the inside of the circulation duct 91, passes through the power supply device 100 in the circulation duct 91, and, thereafter, sucked into the intake port 96*a* again.

As explained above, the second cooling device 90 includes a circulation path 90*a* in which the air AR4 circulates between the third blower 96 and the power supply device 100, which is the second cooling target. In this embodiment, the circulation path 90*a* is configured by the circulation duct 91 and the third blower 96. The circulation path 90*a* passes the inside of the circulation duct 91 and the inside of the third blower 96. The power supply device 100, which is the second cooling target, is disposed on the inside of the circulation path 90*a*. Accordingly, the air AR4 circulating the inside of the circulation path 90*a* passes through the power supply device 100 and takes heat from the power supply device 100. The circulation path 90*a* is, for example, sealed. The circulation path 90*a* may be substantially sealed by, for example, providing a slight gap between the circulation duct 91 and the third blower 96.

In this embodiment, the circulation duct 91 includes a first extending section 91*a*, a second extending section 91*b*, a third extending section 91*c*, and a fourth extending section 91*d*. The air AR4 discharged from the exhaust port 96*b* circulates the inside of the first extending section 91*a*, the inside of the second extending section 91*b*, the inside of the third extending section 91*c*, and the inside of the fourth extending section 91*d* in this order.

The first extending section 91*a* extends to the other side (the −DR side) in the rotation axis direction DR from the exhaust port 96*b*. The second extending section 91*b* extends from the end portion on the other side in the rotation axis direction DR in the first extending section 91*a* to one side (the +DE side) in the extending direction DE. The third extending direction 91*c* extends from the end portion on one side in the extending direction DE in the second extending direction 91*b* to one side (the +DR side) in the rotation axis direction DR. The fourth extending section 91*d* extends from the end portion on one side in the rotation axis direction DR in the third extending section 91*c* to the other side (the −DE side) in the extending direction DE. The fourth extending section 91*d* is disposed spaced apart from the circulation duct 25 on the other side in the rotation axis direction DR. The end portion on the other side in the extending direction DE in the fourth extending section 91*d* is connected to the intake port 96*a*.

The circulation duct 91 includes a through-hole 91*e* that pierces through a wall section of the circulation duct 91. The through-hole 91*e* is provided in a portion of the circulation duct 91 where the air AR4 passed through the power supply device 100 circulates until being sucked into the intake port 96*a*. The through-hole 91*e* is provided in, for example, a wall section disposed in a position closest to the circulation duct 25 among wall sections forming the fourth extending section 91*d*. In FIG. 3, the through-hole 91*e* pierces through, in the rotation axis direction DR, a wall section located on one side (the +DR side) in the rotation axis direction DR among the wall sections forming the fourth extending section 91*d*. The through-hole 91*e* is opposed to, in the rotation axis direction DR, the through-hole 25*c* provided in the circulation duct 25.

Communicating sections 91*h* connecting the inside of the circulation path 90*a* and the outside of the circulation path 90*a* are provided in the circulation path 90*a*. In this embodiment, the communicating parts 91*h* are holes that pierce through the wall section of the circulation duct 91. The communicating parts 91*h* include a first communicating part 91*f* and a second communicating part 91*g*. The first communicating part 91*f* is provided in a portion of the inside of the circulation path 90*a* where the air AR4 passed through the power supply device 100 circulates until reaching a heat absorber 95*b* explained below. The first communicating part 91*f* is provided in, for example, a wall section of the third extending section 91*c*. The second communicating part 91*g* is provided in a portion of the inside of the circulation path 90*a* where the air AR4 passed through the heat absorber 95*b* circulates until reaching the power supply device 100. The second communicating part 91*g* is provided in, for example, a wall section of the first extending section 91*a*.

The second cooling device 90 includes opening and closing parts 94 that open and close the communication paths 91*h*. In this embodiment, the opening and closing parts 94 include a first opening and closing part 92 that opens and closes the first communicating part 91*f* and a second opening and closing part 93 that opens and closes the second communicating part 91*g*. The first opening and closing part 92 is provided in a portion of the inside of the circulation path 90*a* where the air AR4 passed through the power supply device 100 circulates until reaching the heat absorber 95*b*. The first opening and closing part 92 is provided in, for example, the wall section of the third extending section 91*c*.

Figure 10:
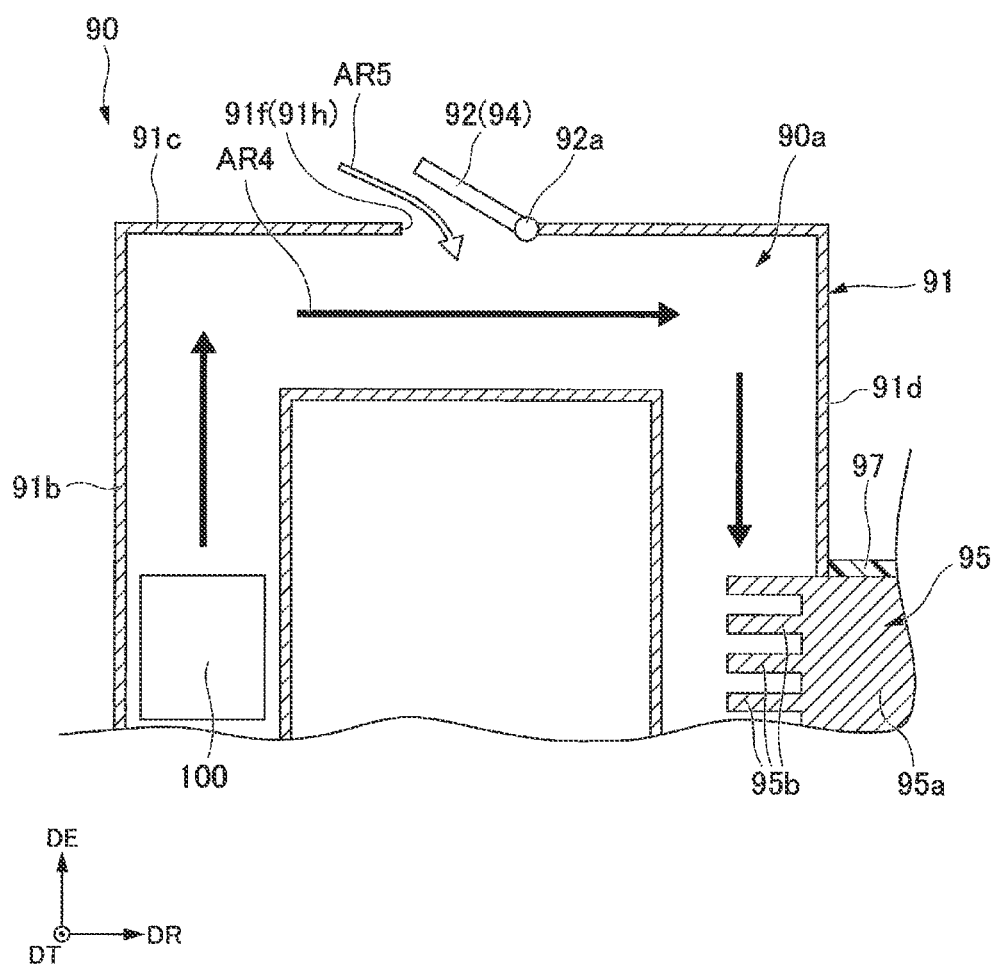
FIG. 10 is a diagram showing a state in which a first opening and closing part in the first embodiment is opened.

In FIG. 3, the first opening and closing part 92 is in a closed state. In the closed state, the first opening and closing part 92 closes the first communicating part 91*f*. FIG. 10 is a diagram showing a state in which the first opening and closing part 92 is opened. As shown in FIG. 10, the first opening and closing part 92 is capable of turning around a hinge section 92*a* attached to the inner edge portion of the first communicating part 91*f*. The first opening and closing part 92 turns around the hinge section 92*a* to be opened and opens the first communicating part 91*f*.

As shown in FIG. 3, the second opening and closing part 93 is provided in a portion of the inside of the circulation path 90*a* where the air AR4 passed through the heat absorber 95*b* circulates until reaching the power supply device 100. The second opening and closing part 93 is provided in, for example, the wall section of the first extending section 91*a*. In FIG. 3, the second opening and closing part 93 is in a closed state. In the closed state, the second opening and closing part 93 closes the second communicating part 91*g*. The second opening and closing part 93 is capable of turning around a hinge section 93*a* attached to the inner edge portion of the second communicating part 91*g*. The second opening and closing part 93 turns around the hinge section 93*a* to be opened and opens the second communicating part 91*g*.

The heat conduction member 95 is coupled to the first cooling device 10 and the second cooling device 90 and is disposed across the first cooling device 10 and the second cooling device 90. More specifically, the heat conduction member 95 is disposed across the inside of the circulation path 90*a* and the inside of the refrigerant generation path 27. In this embodiment, the heat conduction member 95 is disposed across the inside of the circulation duct 91 and the inside of the circulation duct 25. The heat conduction member 95 is, for example, a heat sink. The material of the heat conduction member 95 is metal having relatively high thermal conductivity such as aluminum. The heat conduction member 95 includes a base section 95a, the heat absorber 95b, and a heat dissipator 95c.

The base section 95a is fit in the through-hole 91e of the circulation duct 91 and the through-hole 25c of the circulation duct 25 and fixed. The circulation duct 91 and the circulation duct 25 are coupled by the base section 95a. The surface of a portion of the base section 95a located on the outside of the circulation ducts 25 and 91 is covered by the heat insulating member 97. That is, the surface of a portion of the heat conduction member 95 disposed on the outside of both of the circulation path 90a and the refrigerant generation path 27 is covered by the heat insulating member 97. The heat insulating member 97 is, for example, a heat insulation sheet.

The heat absorber 95b projects from a portion of the base section 95a located on the inside of the circulation duct 91 toward the inside of the circulation duct 91. In this embodiment, the heat absorber 95b is a fin. For example, a plurality of heat absorbers 95b are provided. The heat absorber 95b is disposed on the inside of the circulation path 90a. More specifically, the heat absorber 95b is disposed in a portion of the inside of the circulation path 90a where the air AR4 passed through the power supply device 100 circulates until being sucked into the intake port 96a. The heat absorber 95b is disposed, for example, on the inside of the fourth extending section 91d in the circulation duct 91. In this embodiment, the heat absorber 95b absorbs heat from the air AR4 that circulates on the inside of the circulation path 90a. Consequently, the heat absorber 95b absorbs, via the air AR4, heat emitted from the power supply device 100, which is the second cooling target.

The heat dissipator 95c projects from a portion of the base section 95a located on the inside of the circulation duct 25 toward the inside of the circulation duct 25. In this embodiment, the heat dissipator 95c is a fin. For example, a plurality of heat dissipators 95c are provided. The heat dissipator 95c is disposed on the inside of the first cooling device 10. More specifically, the heat dissipator 95c is disposed in a portion of the inside of the refrigerant generation path 27 where the air AR2 emitted from the heat exchanger 30 circulates until reaching the heating main body 22a. The heat dissipator 95c is disposed, for example, on the inside of a portion of the circulation duct 25 extending in the extending direction DE.

The heat dissipator 95c emits the heat absorbed by the heat absorber 95b. In this embodiment, the heat dissipator 95c emits the heat to the air AR2 before passing through the portion of the moisture absorbing and desorbing member 40 located in the second region F2 and before being heated by the heating main body 22a. The heat emitted to the air AR2 from the heat dissipator 95c is transferred to the portion of the moisture absorbing and desorbing member 40 located in the second region F2 when the air AR2 passes through the portion of the moisture absorbing and desorbing member 40 located in the second region F2.

In the circulation path 90a, the air AR4 passes through the heat absorber 95b from one side (the +DE side) to the other side (the −DE side) in the extending direction DE. On the other hand, in the refrigerant generation path 27, the air AR2 passes through the heat dissipator 95c from the other side to one side in the extending direction DE. That is, in this embodiment, a direction in which the air AR4 passes through the heat absorber 95b and a direction in which the air AR2 passes through the heat dissipator 95c are opposite to each other. The direction in which the air AR4 passes through the heat absorber 95b and the direction in which the air AR2 passes through the heat dissipator 95c may be the same direction. A direction in which the air AR4 passing through the heat absorber 95b flows and a direction in which the air AR2 passing through the heat dissipator 95c flows may be directions crossing each other.

According to this embodiment, the first cooling device 10 can transfer the refrigerant W generated by the refrigerant generator 20 to the first cooling target with the refrigerant sender 50 and take heat from the first cooling target and cool the first cooling target using vaporization of the refrigerant W, which is endothermic reaction. The cooling by the vaporization of the refrigerant W can actively take heat from the first cooling target. Therefore, the cooling by the vaporization of the refrigerant W is excellent in cooling performance compared with when the first cooling target is simply cooled by heat transfer to a refrigerant as in air cooling and liquid cooling. Consequently, when the same cooling performance as the cooling performance of the air cooling and the liquid cooling is obtained, it is easier to reduce the entire first cooling device 10 in size compared with the air cooling and the liquid cooling.

In the case of the cooling by the vaporization of the refrigerant W, it is possible to improve the cooling performance by increasing a surface area of the refrigerant W to be vaporized in contact with the first cooling target. Accordingly, even if the cooling performance by the first cooling device 10 is increased, it is possible to suppress noise from increasing. Therefore, according to this embodiment, the projector 1 including the first cooling device 10 excellent in the cooling performance, small in size, and excellent in silence is obtained.

According to this embodiment, since the refrigerant W can be generated in the refrigerant generator 20, a user does not have to take the trouble to supply the refrigerant W. Convenience for the user can be improved. It is possible to adjust, with the refrigerant generator 20, the refrigerant W to be generated by a necessary amount when necessary. Therefore, the refrigerant W does not have to be stored in a storage tank or the like. The weight of the projector 1 can be reduced.

According to the this embodiment, moisture of water vapor included in the air AR1 sent from the first blower 60 can be absorbed by the moisture absorbing and desorbing member 40. The moisture absorbed by the moisture absorbing and desorbing member 40 can be desorbed, as water vapor, into the air AR2 sent by the second blower 23. The moisture desorbed into the air AR2 as the water vapor can be condensed by the heat exchanger 30 to generate the refrigerant W. Consequently, according to this embodiment, it is possible to generate the refrigerant W from the atmosphere in the projector 1.

In order to desorb the moisture absorbed by the moisture absorbing and desorbing member 40 into the air AR2 as the water vapor, it is necessary to heat the moisture absorbing and desorbing member 40 to a certain degree. However, when an output of the heater 22 that heats the moisture absorbing and desorbing member 40 increases, consumed energy of the projector 1 increases and energy efficiency in generating the refrigerant W is deteriorated.

On the other hand, according to this embodiment, the second cooling device 90 that cools the second cooling target different from the first cooling target and the heat conduction member 95 disposed across the first cooling device 10 and the second cooling device 90 are provided. The heat conduction member 95 includes the heat absorber 95b that absorbs heat emitted from the second cooling target and the heat dissipator 95c that is disposed on the inside of the first cooling device 10 and emits the heat absorbed by the heat absorber 95*b*. The heat emitted from the heat dissipator 95*c* is transferred to the portion of the heat absorbing and desorbing member 40 located in the second region F2.

Accordingly, heat generated in the second cooling target can be transferred to the moisture absorbing and desorbing member 40 via the heat conduction member 95. Consequently, even if the output of the heater 22 that heats the moisture absorbing and desorbing member 40 is reduced, the moisture absorbing and desorbing member 40 can be sufficiently heated. If the heat transferred to the moisture absorbing and desorbing member 40 by the heat conduction member 95 is sufficiently large, the moisture absorbing and desorbing member 40 can be sufficiently heated even if the heater 22 is not provided. In this way, according to this embodiment, it is possible to heat the moisture absorbing and desorbing member 40 using the heat generated in the second cooling target. Accordingly, it is possible to reduce the consumed energy of the projector 1 and improve the energy efficiency in generating the refrigerant W. Therefore, it is possible to improve refrigerant generation efficiency in the refrigerant generator 20.

The second cooling device 90 includes the circulation path 90*a* on the inside of which the second cooling target is disposed and in which the air AR4 circulates between the third blower 96 and the second cooling target. Accordingly, heat taken from the second cooling target by the air AR4 is not uselessly emitted to the outside and can be stored in the circulation path 90*a*. Consequently, the heat emitted from the second cooling target is easily transferred to the moisture absorbing and desorbing member 40 without waste via the heat conduction member 95. Therefore, it is easier to heat the moisture absorbing and desorbing member 40 using the heat generated in the second cooling target. Accordingly, it is possible to further improve the refrigerant generation efficiency in the refrigerant generator 20.

If a heat quantity per hour emitted from the second cooling target is larger than a heat quantity per hour transferred to the moisture absorbing and desorbing member 40 via the heat conduction member 95, heat is accumulated in the air AR4 that circulates in the circulation path 90*a*. Accordingly, the temperature of the air AR4 circulating in the circulation path 90*a* rises every time the air AR4 circulates in the circulation path 90*a*. Since the temperature of the air AR4 rises, the temperature of the second cooling target after being cooled by the air AR4 also rises. Consequently, the difference between the temperature in the circulation path 90*a* and the temperature in the refrigerant generation path 27 increases. Heat exchange efficiency via the heat conduction member 95 increases. Therefore, it is possible to make it easier to transfer the heat of the second cooling target to the moisture absorbing and desorbing member 40. Accordingly, it is possible to further improve the refrigerant generation efficiency in the refrigerant generator 20.

According to this embodiment, the heat absorber 95*b* absorbs heat from the air AR4 that circulates on the inside of the circulation path 90*a*. That is, heat taken from the second cooling target by the air AR4 can be absorbed by the heat absorber 95*b*. Accordingly, even when the second cooling target is provided in a position relatively away from the refrigerant generator 20, it is possible to cause the heat absorber 95*b* to absorb, via the air AR4 circulating in the circulation path 90*a*, the heat emitted from the second cooling target. Consequently, it is possible to improve flexibility of relative disposition of the second cooling target and the refrigerant generator 20.

According to this embodiment, the refrigerant generator 20 includes the heater 22 that heats the portion of the moisture absorbing and desorbing member 40 located in the second region F2. Accordingly, even when heating of the moisture absorbing and desorbing member 40 is insufficient only with the heat transferred from the second cooling target via the heat conduction member 95, it is possible to suitably heat the moisture absorbing and desorbing member 40 by heating the moisture absorbing and desorbing member 40 with the heater 22. Even in this case, the output of the heater 22 can be reduced compared with when heat is not transferred to the moisture absorbing and desorbing member 40 from the heat conduction member 95. Therefore, it is possible to improve the energy efficiency in generating the refrigerant W.

According to this embodiment, the heater 22 includes the heating main body 22*a* that heats air before passing through the portion of the moisture absorbing and desorbing member 40 located in the second region F2 and the second blower 23. Accordingly, the heater 22 can heat the portion of the moisture absorbing and desorbing member 40 located in the second region F2 by sending the air AR2 to the moisture absorbing and desorbing member 40 with the second blower 23. Consequently, even if the heating main body 22*a* is disposed in a position away from the moisture absorbing and desorbing member 40, the moisture absorbing and desorbing member 40 can be heated by the heater 22. Therefore, it is possible to improve flexibility of the configuration of the heater 22.

According to this embodiment, the heat dissipator 95*c* emits heat to the air AR2 before passing the portion of the moisture absorbing and desorbing member 40 located in the second region F2 and before being heated by the heating main body 22*a*. Accordingly, the temperature of the air AR2 before reaching the heating main body 22*a* can be raised by the heat emitted from the heat dissipator 95*c*. Consequently, it is possible to reduce a temperature width of the air AR2 raised by the heating main body 22*a*. Therefore, it is possible to reduce consumed energy of the heating main body 22*a* and improve the refrigerant generation efficiency in the refrigerant generator 20.

According to this embodiment, the communicating parts 91*h* that connect the inside of the circulation path 90*a* and the outside of the circulation path 90*a* are provided in the circulation path 90*a*. The second cooling device 90 includes the opening and closing parts 94 that open and close the communicating parts 91*h*. Accordingly, as shown in FIG. 10, by opening the opening and closing parts 94, it is possible to take air AR5 having relatively low temperature into the inside of the circulation path 90*a* from the outside of the circulation path 90*a*. Consequently, it is possible to suppress the temperature of the air AR4 in the circulation path 90*a* from becoming excessively high. Therefore, it is possible to suppress the second cooling target from becoming less easily cooled by the air AR4 that circulates in the circulation path 90*a*.

According to this embodiment, the opening and closing parts 94 include the first opening and closing part 92 provided in the portion of the inside of the circulation path 90*a* where the air AR4 passed through the second cooling target until reaching the heat absorber 95*b*. The air AR4 after passing through the second cooling target and before reaching the heat absorber 95*b* is in a state in which the air AR4 absorbs heat of the second cooling target and heat of the air AR4 is not absorbed by the heat absorber 95*b*. Accordingly, the air AR4 before reaching the heat absorber 95*b* after passing through the second cooling target is in a state in which temperature is relatively high in the air AR4 that circulates in the circulation path 90a. Consequently, it is easy to suddenly drop the temperature of the air AR4 in the circulation path 90a by opening the first opening and closing part 92 to open the first communicating part 91f and taking in the air AR5 having relatively low temperature. Therefore, even when the temperature of the air AR4 in the circulation path 90a is excessively high, it is possible to quickly drop the temperature of the air AR4.

According to this embodiment, the opening and closing parts 94 include the second opening and closing part 93 provided in the portion of the inside of the circulation path 90a where the air AR4 passed through the heat absorber 95b circulates until reaching the second cooling target. The air AR4 after passing through the heat absorber 95b and before reaching the second cooling target is in a state in which heat of the air AR4 is absorbed by the heat absorber 95b and a state before the air AR4 absorbs heat from the second cooling target again. Accordingly, the air AR4 before reaching the second cooling target after passing through the heat absorber 95b is in a state in which temperature is relatively low in the air AR4 that circulates in the circulation path 90a. Consequently, even when the second opening and closing part 93 is opened to open the second communicating part 91g and the air AR5 having relatively low temperature is taken in, the temperature of the air AR4 in the circulation path 90a less easily drops. Therefore, when the temperature of the air AR4 in the circulation path 90a is dropped, it is easy to finely adjust the temperature of the air AR4. Accordingly, it is possible to suitably adjust the temperature of the air AR4 in the circulation path 90a. In this embodiment, since the opening and closing parts 94 include both of the first opening and closing part 92 and the second opening and closing part 93, it is possible to more suitably adjust the temperature of the air AR4 in the circulation path 90a by opening and closing the opening and closing parts 94 as appropriate.

As explained above, when the air AR4 is circulated in the circulation path 90a, the temperature of the second cooling target after being cooled by the air AR4 rises as the temperature of the air AR4 rises. Consequently, a heat resistant temperature of the second cooling target is low, it is likely that the temperature in the circulation path 90a can not be suitably raised and a heat quantity transferred to the moisture absorbing and desorbing member 40 via the heat conduction member 95 is less easily increased.

On the other hand, according to this embodiment, the second cooling target includes the power supply device 100 of the projector 1. The power supply device 100 has a relatively high heat resistant temperature among cooling targets in the projector 1. Accordingly, the temperature in the circulation path 90a can be set relatively high. Consequently, it is possible to suitably increase the heat quantity transferred to the moisture absorbing and desorbing member 40 via the heat conduction member 95. Therefore, it is possible to further improve the refrigerant generation efficiency in the refrigerant generator 20.

According to this embodiment, the surfaces of portions disposed on the outsides of both of the circulation path 90a and the refrigerant generation path 27 in the heat conduction member 95 are covered by the heat insulating member 97. Accordingly, it is possible to suppress heat transferred from the heat absorber 95b to the heat dissipator 95c from leaking to the outside. Consequently, it is possible to suitably transfer heat of the second cooling target from the heat dissipator 95c to the moisture absorbing and desorbing member 40. Therefore, it is possible to further improve the refrigerant generation efficiency in the refrigerant generator 20.

According to this embodiment, the cooling air AR3 that cools the air AR2 in the internal space 35 flows to, via the channel sections 34, the insides of the plurality of channel sections 34 disposed in the internal space 35 of the housing 31. Accordingly, in the internal space 35, it is possible to condense water vapor included in the air AR2 and generate the refrigerant W. The air AR2 in the internal space 35 is cooled via the surfaces of the plurality of channel sections 34 exposed in the internal space 35. Accordingly, for example, as the number of the channel sections 34 is increased, the surface area of the channel sections 34 exposed in the internal space 35 can be increased and the air AR2 can be more easily cooled. Consequently, it is easy to condense water vapor included in the air AR2 and generate the refrigerant W. Therefore, it is possible to further improve the refrigerant generation efficiency in the refrigerant generator 20.

As the outer diameter of the channel sections 34 is reduced, the number of the channel sections 34 that can be disposed in the internal space 35 increases. On the other hand, when the outer diameter of the channel sections 34 is reduced, a surface area of one channel section 34 decreases. However, since the number of the channel sections 34 that can be disposed in the internal space 35 can be increased, as a result, it is easy to increase a total of surface areas of the plurality of channel sections 34. Consequently, it is possible to further improve the refrigerant generation efficiency in the refrigerant generator 20.

Since a refrigerant generation amount in the refrigerant generator 20 can be improved, it is also possible to reduce the heat exchanger 30 in size while maintaining a generation amount of the refrigerant W in the heat exchanger 30. Consequently, the projector 1 can be reduced in size.

As the number of the channel sections 34 is increased as explained above, a gap among the channel sections 34 decreases. In this case, a flow of the air AR2 in the internal space 35 is considered to be hindered because, for example, a pressure loss that occurs in the air AR2 passing through the internal space 35 increases and unevenness occurs in the flow of the air AR2. However, in the internal space 35, as a residence time of the air AR2 is longer, a time for condensing the water vapor included in the air AR2 can be increased. Accordingly, it is possible to generate more refrigerant W from the air AR2 by increasing the number of the channel sections 34 and hindering the flow of the air AR2 in the internal space 35 to a certain degree. Consequently, it is possible to further improve the refrigerant generation efficiency in the refrigerant generator 20.

For example, when air from the second blower is fed into the plurality of channel sections to generate the refrigerant W in the plurality of channel sections, it is likely that the channel sections are clogged by the refrigerant W. In particular, when the temperature of an environment in which the projector 1 is set is relatively low, it is likely that the refrigerant W coagulates and the channel sections are clogged.

On the other hand, according to this embodiment, the refrigerant W is generated in the internal space 35 rather than in the channel sections 34. Accordingly, the channel sections 34 are not clogged by the generated refrigerant W. The refrigerant W is easily gathered in one place in the internal space 35 compared with when the refrigerant W is generated in the plurality of channels 34. Accordingly, even when, for example, a posture of the projector 1 changes, the refrigerant W in the internal space 35 is easily sent to the first cooling target by the refrigerant sender 50.

For example, when the air from the second blower is fed into the plurality of channel sections to generate the refrigerant W in the plurality of channel sections, air is sent to the plurality of channel sections from the outside to cool the air in the channel sections. In this case, fluctuation easily occurs in the blowing from the outside in each of the plurality of channel sections. Accordingly, it is likely that a degree of generation of the refrigerant W fluctuates in each of the channel sections.

On the other hand, according to this embodiment, the air AR2 in the internal space 35 is cooled by the cooling air AR3 flowing on the insides of the channel sections 34. Accordingly, by uniformly disposing the channel sections 34 in the internal space 35, it is easy to uniformly cool the entire air AR2 in the internal space 35. Consequently, it is possible to make it easier to generate the refrigerant W in the internal space 35 and further improve the refrigerant generation efficiency of the refrigerant generator 20.

By setting flow velocity of the cooling air AR3 flowing in the channel sections 34 relatively large, it is possible to make it easier to cool the air AR2 in the internal space 35 with the cooling air AR3. On the other hand, when the flow velocity of the cooling air AR3 is set to relatively large, noise due to the flow of the cooling air AR3 tends to increase. However, in this embodiment, since the cooling air AR3 passes through the insides of the channel sections 34 disposed in the internal space 35, the noise due to the flow of the cooling air AR3 less easily leaks to the outside of the housing 31. Therefore, it is possible to suppress noise that occurs from the projector 1 from increasing while setting the flow velocity of the cooling air AR3 relatively large and improving cooling efficiency of the air AR2 in the internal space 35.

A channel area in the channel sections 34 is smaller than a channel area of the internal space 35. Accordingly, the flow velocity of the cooling air AR3 flowing in the channel sections 34 tends to be larger than flow velocity of the air AR2 flowing in the internal space 35. Consequently, the flow velocity of the cooling air AR3 is easily set relatively large in the channel sections 34. Therefore, it is easy to suitably cool the air AR2 in the internal space 35 with the cooling air AR3 via the channel sections 34. Accordingly, it is possible to further improve the refrigerant generation efficiency of the refrigerant generator 20.

On the other hand, it is easy to set the flow velocity of the air AR2 flowing in the internal space 35 relatively small. Accordingly, it is possible to increase the residence time of the air AR2 in the internal space 35. Consequently, it is possible to increase a time in which the water vapor of the air AR2 is coagulated in the internal space 35. It is possible to make it easier to generate the refrigerant W from the air AR2. Therefore, it is possible to further improve the refrigerant generation efficiency of the refrigerant generator 20.

According to this embodiment, the refrigerant generator 20 includes the fourth blower 61 that sends the cooling air AR3 to the insides of the plurality of channel sections 34. Accordingly, it is easy to send the cooling air AR3 to the insides of the plurality of channel sections 34. It is easy to cool the air AR2 in the internal space 35 via the channel sections 34.

According to this embodiment, the fourth blower 61 sends the cooling air AR3 to the insides of the plurality of channel sections 34 from the inflow ports 34a via the inflow duct 32, on the inside of which the inflow ports 34a of the plurality of channel sections 34 are opened. Accordingly, it is possible to guide, with the inflow duct 32, the cooling air AR3 emitted from the fourth blower 61 to the insides of the channel sections 34. Therefore, it is easy to send the cooling air AR3 to the insides of the channel sections 34.

According to this embodiment, the end portion 54a of the connecting section 54 of the refrigerant sender 50 is exposed in the internal space 35. Accordingly, the end portion 54a of the connecting section 54 can be brought into contact with the refrigerant W generated in the internal space 35. The connecting section 54 is made of a porous member. Accordingly, it is possible to cause the connecting section 54 to absorb the refrigerant W via the end portion 54a and transfer the refrigerant W to the first cooling target with the capillary phenomenon. Consequently, it is possible to easily transfer the refrigerant W generated in the internal space 35 to the first cooling target with the refrigerant sender 50. It is unnecessary to separately prepare power of a pump or the like in order to transfer the refrigerant W. Consequently, it is possible to suppress the number of components of the projector 1 from increasing and further reduce the projector 1 in size and weight.

For example, when the humidity of the air AR2 sent to the heat exchanger 30 from the second blower 23 is relatively low in the refrigerant generator 20, even if the heat exchanger 30 is cooled, the refrigerant W is sometimes less easily generated. For example, when, for example, air on the outside of the projector 1 is mixed in the air AR2, the humidity of the air AR2 sent to the heat exchanger 30 sometimes drops.

On the other hand, according to this embodiment, the refrigerant generator 20 includes the refrigerant generation path 27 in which the air AR2 emitted from the second blower 23 circulates. Accordingly, it is possible to suppress air on the outside of the projector 1 from entering the refrigerant generation path 27 by substantially sealing the refrigerant generation path 27. It is easy to maintain the humidity of the air AR2 sent to the heat exchanger 30 in a relatively high state. Therefore, it is possible to suitably generate the refrigerant W by cooling the internal space 35 via the plurality of channel sections 34.

According to this embodiment, the plurality of channel sections 34 extend in the direction (the extending direction DE) crossing the direction (the rotation axis direction DR) in which the air AR2 flows in the internal space 35. Accordingly, it is easy to bring the air AR2 into contact with the surfaces of the plurality of channel sections 34 in the internal space 35. It is easy to cool the air AR2. Consequently, it is possible to further improve the refrigerant generation efficiency of the refrigerant generator 20.

According to this embodiment, the plurality of channel sections 34 are the linearly extending conduits. Accordingly, it is easy to feed the cooling air AR3 to the insides of the channel sections 34. It is possible to easily form the channel sections 34 and reduce manufacturing cost for the refrigerant generator 20.

According to this embodiment, the plurality of channel sections 34 extend in the directions parallel to one another. Accordingly, in the internal space 35, it is easy to dispose the plurality of channel sections 34 with high space efficiency. Consequently, it is easy to increase the number of the channel sections 34. Therefore, it is possible to further improve the refrigerant generation efficiency of the refrigerant generator 20.

According to this embodiment, the first blower 60 is a cooling blower that sends the air AR1 to the light modulation units 4R, 4G, and 4B, which are the first cooling target. Accordingly, it is easy to vaporize, with the air AR1, the refrigerant W transferred to the light modulation units 4R, 4G, and 4B. It is possible to further cool the light modulation units 4R, 4G, and 4B. It is unnecessary to separately provide, other than the first blower 60, a cooling blower that cools the first cooling target. Therefore, it is possible to suppress the number of components of the projector 1 from increasing and suppress noise from increasing.

As explained above, in this embodiment, vaporization of the refrigerant W sent to the first cooling target is facilitated using the first blower 60, which is an intake fan that takes outside air into the inside of the projector 1. Accordingly, even if an output of the first blower 60 is reduced, it is possible to obtain cooling performance equivalent to cooling performance at the time when the first cooling device 10 is not provided. Therefore, it is possible to reduce the output of the first blower 60, which is the intake fan, and reduce noise that occurs from the first blower 60. It is possible to further improve the silence of the projector 1.

According to this embodiment, the refrigerant generator 20 includes a motor 24 that rotates the moisture absorbing and desorbing member 40. Accordingly, it is possible to rotate the moisture absorbing and desorbing member 40 at fixed speed. Consequently, it is possible to cause the portion of the moisture absorbing and desorbing member 40 located in the first region F1 to suitably absorb water vapor from the air AR1. It is possible to cause the portion of the moisture absorbing and desorbing member 40 located in the second region F2 to suitably desorb moisture to the air AR2. Therefore, it is possible to efficiently generate the refrigerant W.

Accordingly to this embodiment, the refrigerant holding section 71 that holds the refrigerant W is provided in each of the light modulation units 4R, 4G, and 4B, which are the first cooling target. Accordingly, the refrigerant W transferred to each of the light modulation units 4R, 4G, and 4B can be held in each of the light modulation units 4R, 4G, and 4B by the refrigerant holding section 71 until the refrigerant W vaporizes. Consequently, it is easy to use the generated refrigerant W without waste. It is possible to further improve the cooling performance of the first cooling device 10.

According to this embodiment, the refrigerant holding section 71 is attached to the surface of each of the light modulation units 4R, 4G, and 4B, which are the first cooling target, and is made of the porous member. At least a part of the refrigerant holding section 71 is exposed when viewed from the refrigerant holding section 71 side in the superimposing direction. Accordingly, it is easy to vaporize the refrigerant W from the exposed portion of the refrigerant holding section 71. It is possible to further improve the cooling performance of the first cooling device 10. Since the refrigerant holding section 71 is made of the porous member, it is easy to uniformly spread, with the capillary phenomenon, the refrigerant W over the surface of the first cooling target in which the refrigerant holding section 71 is provided. It is easier to cool the first cooling target.

For example, when the refrigerant holding section 71 is fixed to the holding frame 80 by an adhesive, in some case, the adhesive is absorbed by the refrigerant holding section 71 and holes of the refrigerant holding section 71, which is made of the porous member, are closed. Accordingly, in some case, the refrigerant W is less easily absorbed by the refrigerant holding section 71 and the refrigerant W is less easily held by the refrigerant holding section 71.

On the other hand, according to this embodiment, the fixing member 72 that holds the refrigerant holding section 71 between the fixing member 72 and the holding frame 80 and fixes the refrigerant holding section 71 is provided. Accordingly, the refrigerant holding section 71 can be fixed to the holding frame 80 without using the adhesive. Consequently, it is possible to suppress the refrigerant W from being less easily held by the refrigerant holding section 71. In this embodiment, the fixing member 72 is made of metal. Accordingly, the fixing member 72 has relatively high thermal conductivity and is easily cooled. Therefore, the temperature of the fixing member 72 easily drops with the air AR1 from the first blower 60 and vaporization of the refrigerant W. It is easier to cool the first cooling target that is in contact with the fixing member 72.

According to this embodiment, the refrigerant holding section 71 is provided on the surface on the light incident side of the light modulator 4GP in the holding frame 80. Accordingly, it is possible to suppress water vapor of the refrigerant W vaporized from the refrigerant holding section 71 from affecting light emitted to the light combination optical system 5 from the light modulator 4GP. Consequently, it is possible to suppress noise from occurring in an image projected from the projector 1.

According to this embodiment, the refrigerant holding section 71 is provided in each of the plurality of light modulation units 4R, 4G, and 4B. The coupling sections 73a and 73b that couple the plurality of refrigerant holding sections 71 to one another are provided. Accordingly, by connecting the refrigerant sender 50 to one refrigerant holding section 71, it is possible to transfer the refrigerant W to the other refrigerant holding sections 71. Consequently, it is possible to simplify routing of the refrigerant sender 50 on the inside of the projector 1.

According to this embodiment, the covering sections 74 that respectively cover the coupling sections 73a and 73b are provided in the coupling sections 73a and 73b. Accordingly, it is possible to suppress the refrigerant W moving along the coupling sections 73a and 73b from vaporizing in the coupling sections 73a and 73b. Consequently, it is possible to suppress the refrigerant W from vaporizing without contributing to the cooling of the light modulation units 4R, 4G, and 4B, which are the first cooling target. It is possible to suppress the generated refrigerant W from being wasted.

In this embodiment, the connecting section 54 may be covered like the coupling sections 73a and 73b. With this configuration, it is possible to suppress the refrigerant W from vaporizing while being transferred to the first cooling target. Accordingly, it is possible to efficiently transfer the refrigerant W to the first cooling target and suppress the generated refrigerant W from being wasted. The connecting section 54 and the coupling sections 73a and 73b may be covered by tubes or the like. Coating treatment for suppressing vaporization may be applied to the surfaces of the connecting section 54 and the coupling sections 73a and 73b.

Modification

Figure 11:
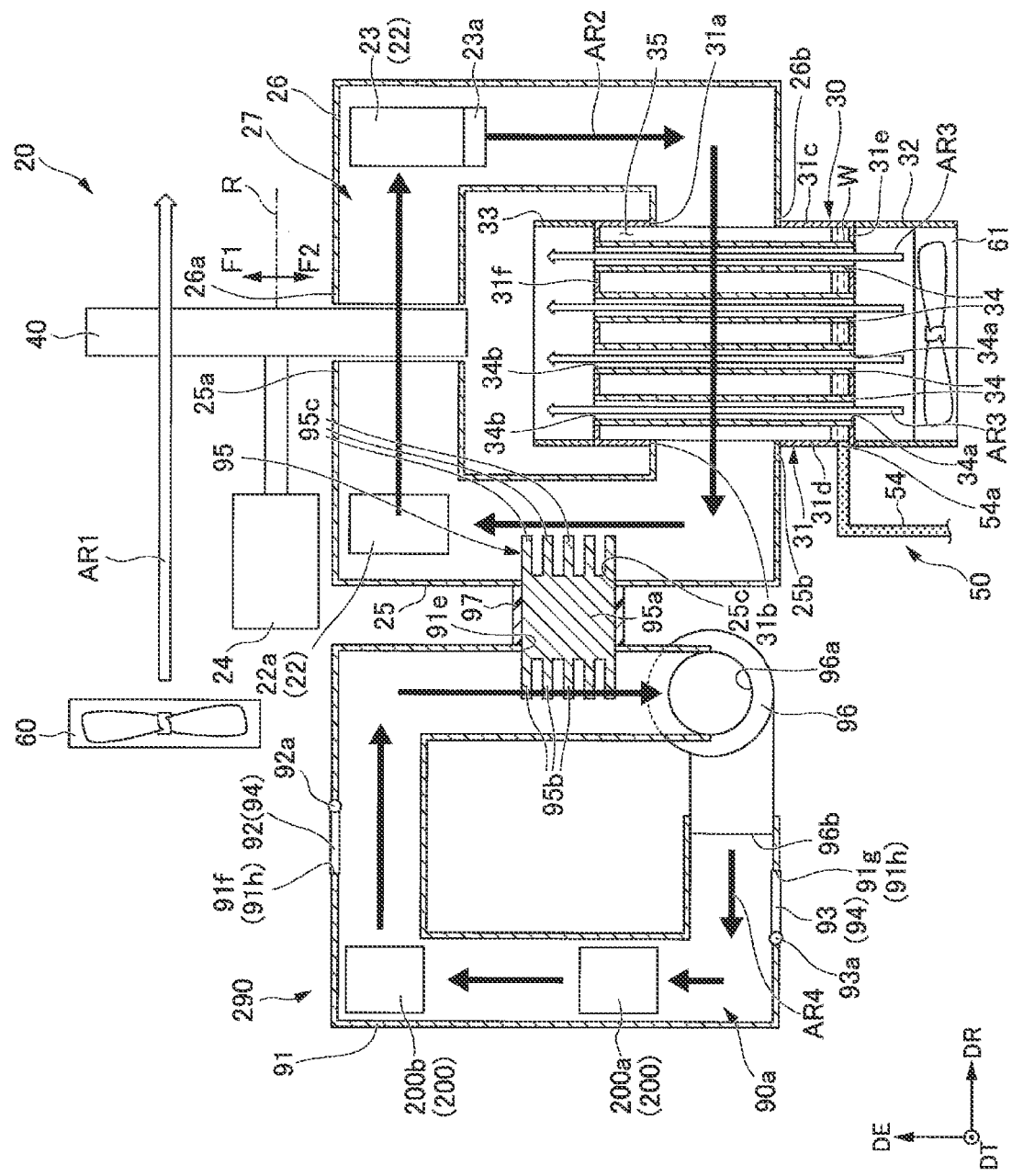
FIG. 11 is a schematic configuration diagram schematically showing a refrigerant generator and a second cooling device in a modification of the first embodiment.

FIG. 11 is a schematic configuration diagram schematically showing the refrigerant generator 20 and a second cooling device 290 in a modification. Explanation about the same components as the components in the embodiment is sometimes omitted by, for example, denoting the components with the same reference numerals and signs as appropriate.

As shown in FIG. 11, in the second cooling device 290 in this modification, heat sinks 200a and 200b are provided as a plurality of second cooling targets in the circulation path 90a. The heat sinks 200a and 200b are heat sinks provided in a power supply device 200. Although illustration is omitted, the power supply device 200 is configured by, for example, coupling two circuit sections disposed in positions separated from each other. The heat sink 200a and the heat sink 200b are respectively provided in the two circuit sections of the power supply device 200. In a flow of the air AR4 discharged from the exhaust port 96b of the third blower 96 until reaching the heat absorber 95b, the heat sink 200a is located further apart on an upstream than the heat sink 200b. That is, the air AR4 discharged from the exhaust port 96b passes through the heat sink 200b after passing through the heat sink 200a. The other components of the second cooling device 290 are the same as the other components of the second cooling device 90 explained above.

In this modification, the first communicating part 91f and the first opening and closing part 92 are provided in portions of the circulation path 90a where the air AR4 passed through the heat sink 200b on the most downstream of the heat sinks 200a and 200b, which are the plurality of second cooling targets, circulates until reaching the heat absorber 95b. The first communicating part 91f and the second opening and closing part 93 are provided in portions of the circulation path 90a where the air AR4 passed through the heat absorber 95b circulates until reaching the heat sink 200a on the most upstream of the heat sinks 200a and 200b, which are the plurality of second cooling targets.

According to this modification, the second cooling targets include the heat sinks 200a and 200b provided in the power supply device 200. The heat sinks 200a and 200b have particularly high heat resistant temperature in the power supply device 200. Accordingly, the temperature in the circulation path 90a can be set higher. Consequently, it is possible to suitably increase a heat quantity transferred to the moisture absorbing and desorbing member 40 via the heat conduction member 95. Therefore, it is possible to further improve the refrigerant generation efficiency in the refrigerant generator 20.

According to this modification, the plurality of second cooling targets are provided in the circulation path 90a. Accordingly, heat generated in the plurality of second cooling targets can be transferred to the moisture absorbing and desorbing member 40 via the heat conduction member 95. Consequently, it is possible to further increase the heat quantity that can be transferred to the moisture absorbing and desorbing member 40 via the heat conduction member 95. Therefore, it is possible to further improve the refrigerant generation efficiency in the refrigerant generator 20.

Second Embodiment

Figure 12:
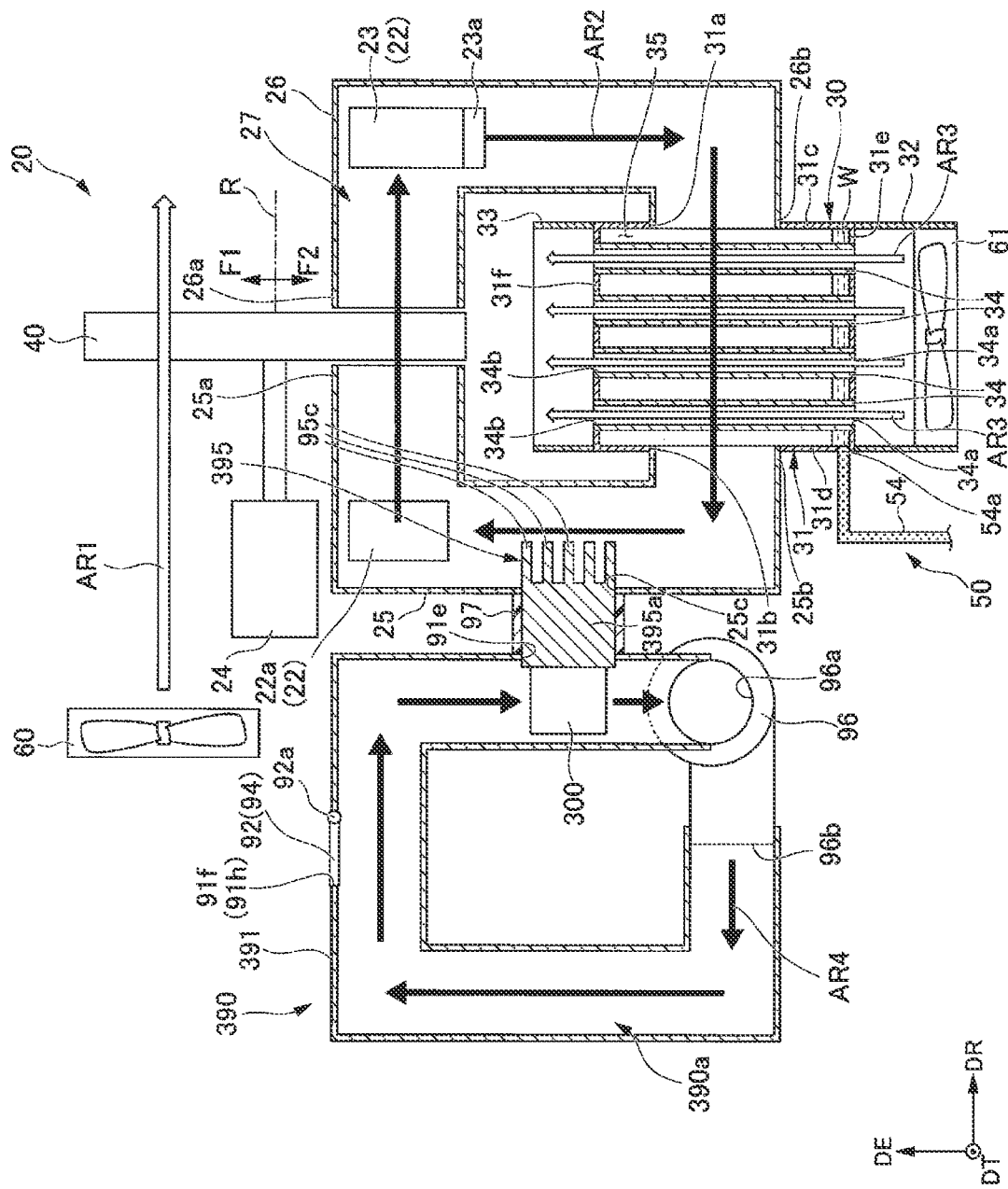
FIG. 12 is a schematic configuration diagram schematically showing a refrigerant generator and a second cooling device in a second embodiment.

A second embodiment is different from the first embodiment in the configuration of a heat conduction member 395. FIG. 12 is a schematic configuration diagram schematically showing the refrigerant generator 20 and a second cooling device 390 in this embodiment. Explanation about the same components as the components in the embodiment explained above is sometimes omitted by, for example, denoting the components with the same reference numerals and signs as appropriate.

As shown in FIG. 12, in the second cooling device 390, a circulation duct 391 is different from the circulation duct 91 in the first embodiment and does not include the second communicating part 91g and the second opening and closing part 93. The other components of the circulation duct 391 are the same as the components of the circulation duct 91 in the first embodiment. A circulation path 390a in this embodiment is configured by the circulation duct 391 and the third blower 96.

The thermal conduction member 395 includes a heat absorber 395a and the heat dissipator 95c. The heat absorber 395a has the same shape as the shape of the base section 95a in the first embodiment. Like the base section 95a, the heat absorber 395a is disposed across the inside of the circulation duct 391 and the inside of the circulation duct 25. The heat conduction member 395 is different from the heat conduction member 95 in the first embodiment and does not include the heat absorber 95b, which is the fin located in the circulation path 390a.

A power supply device 300 is connected to a portion of the heat absorber 395a located on the inside of the circulation path 390a. In this embodiment, the power supply device 300 is a second cooling target. That is, the heat absorber 395a is coupled to the second cooling target. The other components of the power supply device 300 are the same as the other components of the power supply device 100 in the first embodiment.

According to this embodiment, the heat absorber 395a is coupled to the second cooling target. Accordingly, heat of the second cooling target can be directly absorbed by the heat absorber 395a. Consequently, the heat emitted from the second cooling target can be suitably absorbed by the heat absorber 395a. Therefore, it is possible to make it easy to transfer the heat emitted from the second cooling target to the moisture absorbing and desorbing member 40 via the heat conduction member 395. Accordingly, it is possible to further improve the refrigerant generation efficiency in the refrigerant generator 20.

When the second cooling target is the power supply device 300, a heat sink of the power supply device 300 can be used as the heat conduction member 395. That is, a configuration can be adopted in which a main body of the power supply device 300 is disposed on the inside of the circulation path 390a and the heat sink of the power supply device 300 is disposed on the inside of the refrigerant generation path 27 as the heat conduction member 395. Consequently, it is unnecessary to separately prepare the heat conduction member 395. It is possible to suppress the number of components of the projector 1 from increasing.

In this case, for example, even if the power supply device 300 is not disposed in the circulation path 390a, by disposing, in the refrigerant generation path 27, the heat conduction member 395 functioning as the heat sink of the power supply device 300, the power supply device 300 can be cooled to a certain degree with the air AR2 flowing in the refrigerant generation path 27. However, flow velocity of the air AR2 flowing in the refrigerant generation path 27 is often lower than flow velocity of air blown when a cooling target is cooled. Accordingly, it is hard to sufficiently cool the power supply device 300 only with the air AR2 flowing in the refrigerant generation path 27. On the other hand, in this embodiment, since the power supply device 300 is disposed across the circulation path 390a and the refrigerant generation path 27, it is possible to generate the refrigerant W suitably using the heat generated in the power supply device 300 while sufficiently cooling the power supply device 300.

Embodiments of the present disclosure are not limited to the embodiments explained above. Configurations explained below can also be adopted.

The heat conduction member is not particularly limited if heat can be transferred. The material forming the heat conduction member is not particularly limited. A method of transferring heat emitted from the heat dissipator of the heat conduction member to the portion of the moisture absorbing and desorbing member located in the second region is not particularly limited. For example, the heat dissipator may be set in contact with the portion of the moisture absorbing and desorbing member located in the second region. The heat may be directly transferred from the heat dissipator to the moisture absorbing and desorbing member. The communicating part and the opening and closing part may not be provided. The entire third blower may be housed on the inside of the circulation duct. In this case, the circulation path may be configured by only an annular circulation duct. For example, when the heat absorber is coupled to the second cooling target as in the second embodiment explained above, the heat absorber may absorb heat from the air circulating on the inside of the circulation path in addition to directly absorbing heat from the second cooling target.

The refrigerant generation path in which the air emitted from the second blower circulates may not be provided in the refrigerant generator. The configuration of the heat exchanger is not particularly limited. A method of feeding the cooling air to the insides of the plurality of channel sections is not particularly limited. For example, in the embodiments explained above, the air AR1 emitted from the first blower 60 may be fed into the insides of the channel sections 34 as the cooling air. With this configuration, it is unnecessary to separately provide the fourth blower 61. It is possible to suppress the number of components of the projector 1 from increasing. It is possible to suppress noise that occurs from the projector 1 from increasing compared with when the fourth blower 61 is separately provided. This configuration may be, for example, a configuration in which the inflow duct 32 is extended to one side (the +DR side) in the rotation axis direction DR of the moisture absorbing and desorbing member 40 and the air AR1 passed through the moisture absorbing and desorbing member 40 is fed into the inflow duct 32.

The configuration of the channel sections is not particularly limited if the channel sections are disposed in the internal space and the insides of the channel sections are separated from the internal space. The channel sections may extend in a curved line shape. The channel sections may not be the conduits. For example, the channel sections may be configured by forming holes, through which the cooling air passes, on the inside of a columnar pillar section or the like disposed in the internal space. The plurality of channel sections may extend in directions different from one another. The number of the channel sections is not particular limited if the number is two or more.

The position of the inflow hole section provided in the housing and the position of the outflow hole section provided in the housing are not particularly limited. For example, in the embodiments explained above, the inflow hole section 31a and the outflow hole section 31b may be disposed in positions not overlapping each other when viewed along the rotation axis direction DR. The inflow hole section 31a and the outflow hole section 31b may be provided in the same sidewall section in the housing 31. In this case, it is possible to make it easy to cause the air AR2 to stay in the internal space 35. It is easy to improve the refrigerant generation efficiency.

The refrigerant generator may include an external blower that sends air from the outside of the housing to the housing. As the external blower, for example, a component such as an external blower 460 indicated by an alternate long and two short dashes line in FIG. 5 can be adopted. The external blower 460 is located on the other side (the −DT side) in the thickness direction of the housing 31. The external blower 460 is, for example, an axial fan. The external blower 460 sends air AR6 from the outside of the housing 31 to the housing 31. More specifically, the external blower 460 sends the air AR6 from the other side (the −DT side) to one side (the +DT side) of the housing 31 in the thickness direction DT. By sending the air AR6 with the external blower 460, it is possible to cool the air AR2 in the internal space 35 from the outside of the housing 31. Consequently, it is possible to make it easier to coagulate the water vapor included in the air AR2. It is possible to further improve the refrigerant generation efficiency. The external blower 460 may be a centrifugal fan.

A plurality of fins may be provided on the inner wall surface of the housing of the heat exchanger, that is, the inner side surface forming the internal space. In this case, the area of the inner side surface of the internal space can be increased. It is possible to make it easy to coagulate water vapor included in air on the inner side surface of the internal space. Accordingly, it is possible to improve the refrigerant generation efficiency. In particular, when the external blower explained above is provided, the housing is cooled and the air in the internal space is cooled via the inner side surface of the internal space. Therefore, it is easier to coagulate the water vapor on the inner side surface of the internal space.

A plurality of fins may be provided on the outer wall surface of the housing. With this configuration, it is easier to emit heat to the outside from the inside of the housing. Accordingly, it is easier to cool the air in the internal space. In particular, it is easier to cool the air in the internal space by sending air to the plurality of fins provided on the outer wall surface of the housing with the external blower explained above. Therefore, it is possible to further improve the refrigerant generation efficiency.

The refrigerant sender may include a capturing section made of a porous member disposed in the internal space. By connecting the capturing section to the connecting section, it is possible to absorb, with the capturing section, refrigerant generated in the internal space and transfer the refrigerant to the connecting section. Consequently, it is easier to send the generated refrigerant to the first cooling target without waste.

The heater is not limited to the embodiments explained above. The heater may be configured to come into contact with and heat the moisture absorbing and desorbing member. In this case, the heater may not heat air before passing through the moisture absorbing and desorbing member. The heater may not be provided.

In the embodiments explained above, the cooling blower is the first blower 60 provided in the refrigerant generator 20. However, the cooling blower is not limited to this. The cooling blower may be separately provided other than the blower provided in the refrigerant generator 20. The refrigerant is not particularly limited and may be other than water if the refrigerant can cool the cooling target.

In the embodiments explained above, the first cooling target is the light modulation unit. However, the first cooling target is not limited to this. The first cooling target may include at least one of a light modulator, a light modulation unit, a light source, a wavelength conversion element that converts a wavelength of light emitted from the light source, a diffusing element that diffuses the light emitted from the light source, and a polarization conversion element that converts a polarization direction of the light emitted from the light source. With this configuration, it is possible to cool the sections of the projector in the same manner as explained above.

In the embodiments explained above, the second cooling target is the power supply device or the heat sink provided in the power supply device. However, the second cooling target is not limited to this. The second cooling target is not particularly limited if the second cooling target is a component provided in the projector. Three or more second cooling targets may be provided. When a plurality of second cooling targets are provided, the plurality of second cooling targets may include components of types different from one another.

In the embodiment explained above, the example in which the present disclosure is applied to the projector of the transmission type is explained. However, the present disclosure can also be applied to a projector of a reflection type. The "transmission type" means that a light modulator including a liquid crystal panel is a type for transmitting light. The "reflection type" means that the light modulator is a type for reflecting light. The light modulator is not limited to the liquid crystal panel or the like and may be, for example, a light modulator including a micromirror.

In the embodiments explained above, the example of the projector including the three light modulators is explained. However, the present disclosure can also be applied to a projector including only one light modulator and a projector including four or more light modulators.

The configurations explained in this specification can be combined as appropriate within a range in which the configurations are not contradictory to one another.

What is claimed is:

1. A projector including a first cooling target and a second cooling target different from the first cooling target, the projector comprising:
    a light source configured to emit light;
    a light modulator configured to modulate the light emitted from the light source;
    a first cooling device configured to cool the first cooling target based on transformation of a refrigerant into gas;
    a second cooling device configured to cool the second cooling target; and
    a heat conduction member coupled to the first cooling device and the second cooling device,
    wherein
    the first cooling device includes:
        a refrigerant generator configured to generate the refrigerant; and
        a refrigerant sender configured to transfer the generated refrigerant to the first cooling target,
        the refrigerant generator includes:
            a moisture absorbing and desorbing member configured to rotate;
            a first blower configured to send air to a first portion of the moisture absorbing and desorbing member located in a first region;
            a heat exchanger coupled to the refrigerant sender; and
            a second blower configured to send, to the heat exchanger, the air around a second portion of the moisture absorbing and desorbing member located in a second region different from the first region,
    the second cooling device includes:
        a third blower configured to send the air to the second cooling target; and
        a circulation path on which the second cooling target is disposed and through which the air circulates between the third blower and the second cooling target, the heat conduction member includes:
        a heat absorber disposed on the circulation path and configured to absorb heat radiated from the second cooling target; and
        a heat dissipator disposed on the inside of the first cooling device and configured to radiate the heat absorbed by the heat absorber, and the heat radiated from the heat dissipator is transferred to the second portion of the moisture absorbing and desorbing member.

2. The projector according to claim 1, wherein the heat absorber absorbs heat from the air circulating on the inside of the circulation path.

3. The projector according to claim 1, wherein the heat absorber is coupled to the second cooling target.

4. The projector according to claim 1, wherein the refrigerant generator includes a heater configured to heat the second portion of the moisture absorbing and desorbing member.

5. The projector according to claim 4, wherein
    the second blower causes the air to pass through the second portion and sends the air to the heat exchanger, and
    the heater includes:
        a heating main body configured to heat the air before passing through the second portion; and
        the second blower.

6. The projector according to claim 5, wherein the heat dissipator radiates heat to the air before passing through the second portion and before being heated by the heating main body.

7. The projector according to claim 1, wherein
    a communicating part connecting an inside of the circulation path and an outside of the circulation path is provided in the circulation path, and
    the second cooling device includes an opening and closing part configured to open and close the communicating part.

8. The projector according to claim 7, wherein the opening and closing part includes a first opening and closing part provided in a portion of an inside of the circulation path where the air after passed through the second cooling target circulates until reaching the heat absorber.

9. The projector according to claim 7, wherein the opening and closing part includes a second opening and closing part provided in a portion of an inside of the circulation path where the air after passed through the heat absorber circulates until reaching the second cooling target.

10. The projector according to claim 1, wherein the second cooling target includes a power supply device of the projector.

11. The projector according to claim 1, wherein the second cooling target includes a heat sink provided in a power supply device of the projector.

12. The projector according to claim 1, wherein a plurality of the second cooling targets are provided in the circulation path.

13. The projector according to claim 1, wherein
    the refrigerant generator includes a refrigerant generation path in which the air delivered from the second blower circulates, and
    the refrigerant generation path passes the moisture absorbing and desorbing member and the heat exchanger.

14. The projector according to claim 1, wherein the first cooling target is the light modulator.

* * * * *